US009647051B2

(12) United States Patent
Kim et al.

(10) Patent No.: US 9,647,051 B2
(45) Date of Patent: May 9, 2017

(54) ORGANIC LIGHT EMITTING DIODE DISPLAY AND REPAIRING METHOD THEREOF

(71) Applicant: SAMSUNG DISPLAY CO., LTD., Yongin, Gyeonggi-Do (KR)

(72) Inventors: Deuk Jong Kim, Cheonan-si (KR); Seok Il Kwon, Suwon-si (KR); Yong Ho Yang, Suwon-si (KR)

(73) Assignee: Samsung Display Co., Ltd., Yongin-Si, Gyeonggi-do (KR)

( * ) Notice: Subject to any disclaimer, the term of this patent is extended or adjusted under 35 U.S.C. 154(b) by 93 days.

(21) Appl. No.: 14/818,607

(22) Filed: Aug. 5, 2015

(65) Prior Publication Data

US 2016/0211314 A1  Jul. 21, 2016

(30) Foreign Application Priority Data

Jan. 15, 2015  (KR) ........................ 10-2015-0007632

(51) Int. Cl.
*H01L 27/32*  (2006.01)

(52) U.S. Cl.
CPC .... *H01L 27/3276* (2013.01); *H01L 2251/568* (2013.01)

(58) Field of Classification Search
None
See application file for complete search history.

(56) References Cited

U.S. PATENT DOCUMENTS

| 9,076,748 B2* | 7/2015 | Kim ..................... H01L 27/3276 |
| 2010/0207106 A1* | 8/2010 | Lhee ................... H01L 27/3244 257/40 |
| 2014/0292827 A1* | 10/2014 | Kang ....................... G09G 3/20 345/690 |

FOREIGN PATENT DOCUMENTS

| JP | 2007-066904 A | 3/2007 |
| KR | 10-0299755 | 6/2001 |
| KR | 10-0740936 | 7/2007 |
| KR | 10-0929327 | 11/2009 |
| KR | 10-1232138 | 2/2013 |

* cited by examiner

*Primary Examiner* — Lex Malsawma
(74) *Attorney, Agent, or Firm* — Lee & Morse, P.C.

(57) ABSTRACT

An organic light emitting diode display includes an emission control connector between a driving transistor and an organic light emitting diode of a pixel. The emission control connector connects the driving transistor and the organic light emitting diode and overlaps a portion of a repair line. A first shorting assistance member overlaps the repair line and the emission control connector, and serves to induce a chain reaction to allow a short to form between the repair line and the emission control connector when a low-energy laser beam is applied.

25 Claims, 22 Drawing Sheets

ORGANIC LIGHT EMITTING DIODE DISPLAY AND REPAIRING METHOD THEREOF

CROSS-REFERENCE TO RELATED APPLICATION

Korean Patent Application No. 10-2015-0007632, filed on Jan. 15, 2015, and entitled, "Organic Light Emitting Diode Display and Repairing Method Thereof," is incorporated by reference herein in its entirety.

BACKGROUND

1. Field.

One or more embodiments described herein relate to an organic light emitting diode display and a method for repairing an organic light emitting diode display.

2. Description of the Related Art

An organic light emitting diode includes an organic emission layer between an anode and a cathode. In operation, electrons from the cathode and holes from the anode recombine in the organic emission layer to form excitons. Light is emitted when the excitons change state.

An organic light emitting display uses a plurality of organic light emitting diodes to generate images. Each pixel of the display includes a pixel circuit for driving a corresponding one of the organic light emitting diodes. A pixel failure may occur, for example, based on characteristic deviations of transistors and/or capacitors or based on a short or disconnection of wires in the pixels. For example, the connection wire between a pixel circuit and an organic light emitting diode may become disconnected.

Attempts have been made to repair defective pixels in a display. One approach involves connecting the defective pixel to a dummy circuit in a peripheral portion of the display through a repair line. This may be accomplished, for example, using a laser repair process.

In the laser repair process, a laser beam is irradiated to short-circuit a data wire and to connect the transistor and organic light emitting diode of the defective pixel to a metal repair line, e.g., a gate wire. During this process, the laser beam may experience loss when passing through the substrate and insulating layer. In order to short the connecting member and repair line, the laser beam must have sufficiently high energy in this process. However, the high-energy beam may produce unwanted damage in an area near the shorted portion. As a result, the short circuit may not properly form while the insulating layer or the metal were are destroyed by the excessive energy of the beam.

SUMMARY

In accordance with one or more embodiments, an organic light emitting diode display includes a substrate; a scan line, on the substrate, to transmit a scan signal; a repair line substantially parallel to the scan line; a data line and a driving voltage line crossing the scan line, the data line and the driving voltage line to respectively transmit a data voltage and a driving voltage; a switching transistor connected to the scan line and the data line; a driving transistor connected to the switching transistor; an organic light emitting diode connected to the driving transistor; an emission control connector between the driving transistor and the organic light emitting diode, the emission control connector to connect the driving transistor and the organic light emitting diode and overlapping a portion of the repair line; and a first shorting assistance material overlapping the repair line and the emission control connector, the first shorting assistance material to induce a chain reaction to allow a short to form between the repair line and the emission control connector when a laser beam in a predetermined energy range is applied.

The repair line may includes a different upper layer from the scan line, and the first shorting assistance material includes a same layer as the scan line. The display may include a semiconductor on the substrate; a first insulating layer covering the semiconductor; a second insulating layer on the first insulating layer; and a third insulating layer on the second insulating layer, wherein the scan line is on the first insulating layer and wherein the data line, the driving voltage line, and the emission control connector are on the third insulating layer.

The repair line may be on the second insulating layer, and the first shorting assistance material may be on the first insulating layer. The repair line may include a same layer as the scan line, and the first shorting assistance material may include a different upper layer from the scan line. The repair line may be on the first insulating layer, and the first shorting assistance material may be on the second insulating layer.

The third insulating layer may be on the first shorting assistance material and has a shorting hole exposing the first shorting assistance material; and the emission control connector may have a shorting assistance part that contacts the first shorting assistance material through the shorting hole. The display may include a second shorting assistance material including a same layer as the semiconductor and overlapping the emission control connector and the repair line.

In accordance with one or more other embodiments, an organic light emitting diode display includes a substrate; a scan line, on the substrate, to transmit a scan signal; a repair line substantially parallel to the scan line and having a repair hole; a data line and a driving voltage line crossing the scan line, the data line and the driving voltage line to respectively transmit a data voltage and a driving voltage; a switching transistor connected to the scan line and the data line; a driving transistor connected to the switching transistor; an organic light emitting diode connected to the driving transistor; and an emission control connector between the driving transistor and the organic light emitting diode, the emission control connector to connect the driving transistor and the organic light emitting diode and overlapping a portion of the repair line, wherein the emission control connector overlaps the repair hole. The display may include a shorting hole inside the repair hole, and the emission control connector includes a shorting assistance part in the shorting hole. A diameter of the shorting hole may be less than a diameter of the repair hole.

The display may include a semiconductor on the substrate; a first insulating layer covering the semiconductor; a second insulating layer on the first insulating layer; and a third insulating layer on the second insulating layer, wherein the scan line is on the first insulating layer and wherein the data line, the driving voltage line, and the emission control connector are on the third insulating layer. The shorting hole may be in the first insulating layer, the second insulating layer, and the third insulating layer.

The repair line may be on the second insulating layer. The display may include a first shorting assistance material on the first insulating layer and may be in contact with and overlapping the shorting assistance part. The shorting hole may be in the second insulating layer and the third insulating layer. A melting point of the shorting assistance part of the emission control connector may be lower than a melting point of the repair line. The emission control connector may include aluminum and the repair line may include molybdenum.

The display may include a semiconductor on the substrate; a first insulating layer covering the semiconductor; and a second insulating layer on the first insulating layer, wherein the scan line is on the first insulating layer and wherein the data line, the driving voltage line, and the emission control connector are on the second insulating layer. The shorting hole may be in the first insulating layer and the second insulating layer. The repair line may be on the first insulating layer. The display may include a first shorting assistance material on the substrate and overlapping and in contact with the shorting assistance part. The shorting hole may be in the first insulating layer and the second insulating layer. The first shorting assistance material may include a same layer and a same material as the semiconductor.

BRIEF DESCRIPTION OF THE DRAWINGS

Features will become apparent to those of skill in the art by describing in detail exemplary embodiments with reference to the attached drawings in which.

DETAILED DESCRIPTION

Figure 1:
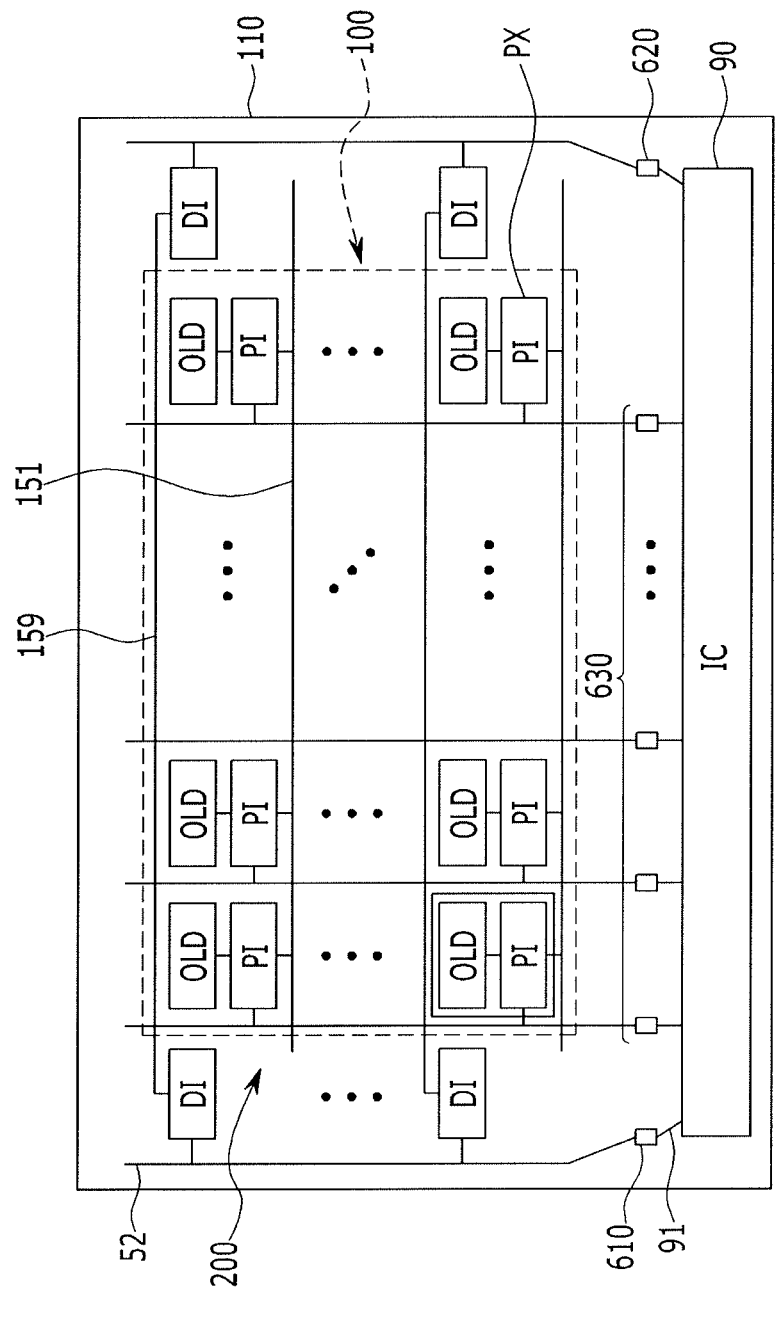
FIG. 1 illustrates an embodiment of a display.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey exemplary implementations to those skilled in the art. The embodiments may be combined to form additional embodiments. Like reference numerals refer to like elements throughout.

In accordance with one or more embodiments, an organic light emitting diode display includes a plurality of pixels, each of which includes a plurality of transistors and at least one capacitor as illustrated in the drawings. However, in other embodiments, each pixel may have a different number of transistors and/or capacitors. Further, additional wires may be added or some wires illustrated may be omitted. In one embodiment, a pixel may be considered to correspond to a minimum unit for displaying an image. For example, the pixel may be a sub pixel emitting one color of light or may constitute a unit pixel including a plurality of sub-pixels emitting light of different colors which combine to form a desired grayscale value.

FIG. 1 illustrates an embodiment of an organic light emitting diode display that includes a substrate 110, a plurality of scan lines 151 formed on the substrate 110, a plurality of data lines 171, a plurality of pixels PX, a plurality of repair lines 159, a pair of surrounding repair lines 52, a plurality of dummy circuit portions D1 connected to the surrounding repair lines 52, a plurality of driving pads 630, a pair of dummy driving pads 610 and 620, and a driving circuit (IC) 90.

The substrate 110 includes a display unit 100 for displaying an image and a peripheral part 200 adjacent the display unit 100. Most of the scan lines 151, the data lines 171, the pixels PX, and the repair lines 159 are formed in the display unit 100. An end of the scan line 151, an end of the data line 171, an end of the repair line 159, the surrounding repair lines 52, the dummy circuit portion DI, the driving pad 630s, the dummy driving pads 610 and 620, and the driving circuit 90 are formed in the peripheral part 200.

The scan lines 151 transmit a scan signal and extends in a first (e.g., horizontal) direction. The data lines 171 transmit data signals and extend in a second (e.g., vertical) direction crossing the first direction.

The pixel PX includes the pixel circuit portion PI connected to the scan line 151 and the data line 171, and an organic light emitting diode OLD connected to the pixel circuit portion PI. The pixel circuit portion PI includes a plurality of transistors and a capacitor to drive the organic light emitting diode OLD. The organic light emitting diode OLD includes a cathode, an anode, and an organic emission layer.

The repair line 159 is formed in the display unit 100 and extends in the horizontal direction. The surrounding repair line 52 is formed in the peripheral part 200 and extends in the vertical direction. The dummy circuit portion DI is formed in the peripheral part 200 and is connected to the repair line 159 and the surrounding repair line 52. The dummy circuit portion DI is formed at a left and right sides of the display unit 100 and is connected to ends of the repair line 159. The dummy circuit portion DI may have the same structure as the pixel circuit portion PI.

The driving pads 630 are connected to ends of the data lines 171. The dummy driving pads 610 and 620 are connected to the ends of the repair lines 52.

The driving circuit 90 transmits the data signals to the driving pads 630 and the dummy driving pads 610 and 620 and may include a timing controller.

A plurality of driving circuit output lines 91 are formed between the driving circuit 90 and the driving pads 630 to connect the driving circuit 90 and the driving pads 630. A driving circuit output line 91 is formed to connect the driving circuit 90 to the dummy driving pads 610 and 620.

The data signal passing through the dummy driving pads 610 and 620 is transmitted to the dummy circuit portion DI through the surrounding repair line 52. A driving current Id generated in the dummy circuit portion DI is transmitted to the organic light emitting diode OLD through the repair line 159, to thereby drive a failed or defective pixel as a normal pixel. To accomplish this, a laser repair process may be performed to isolate the pixel circuit portion PI and the organic light emitting diode OLD in the failed pixel and to short-circuit the repair line 159 and the organic light emitting diode OLD.

Figure 2:
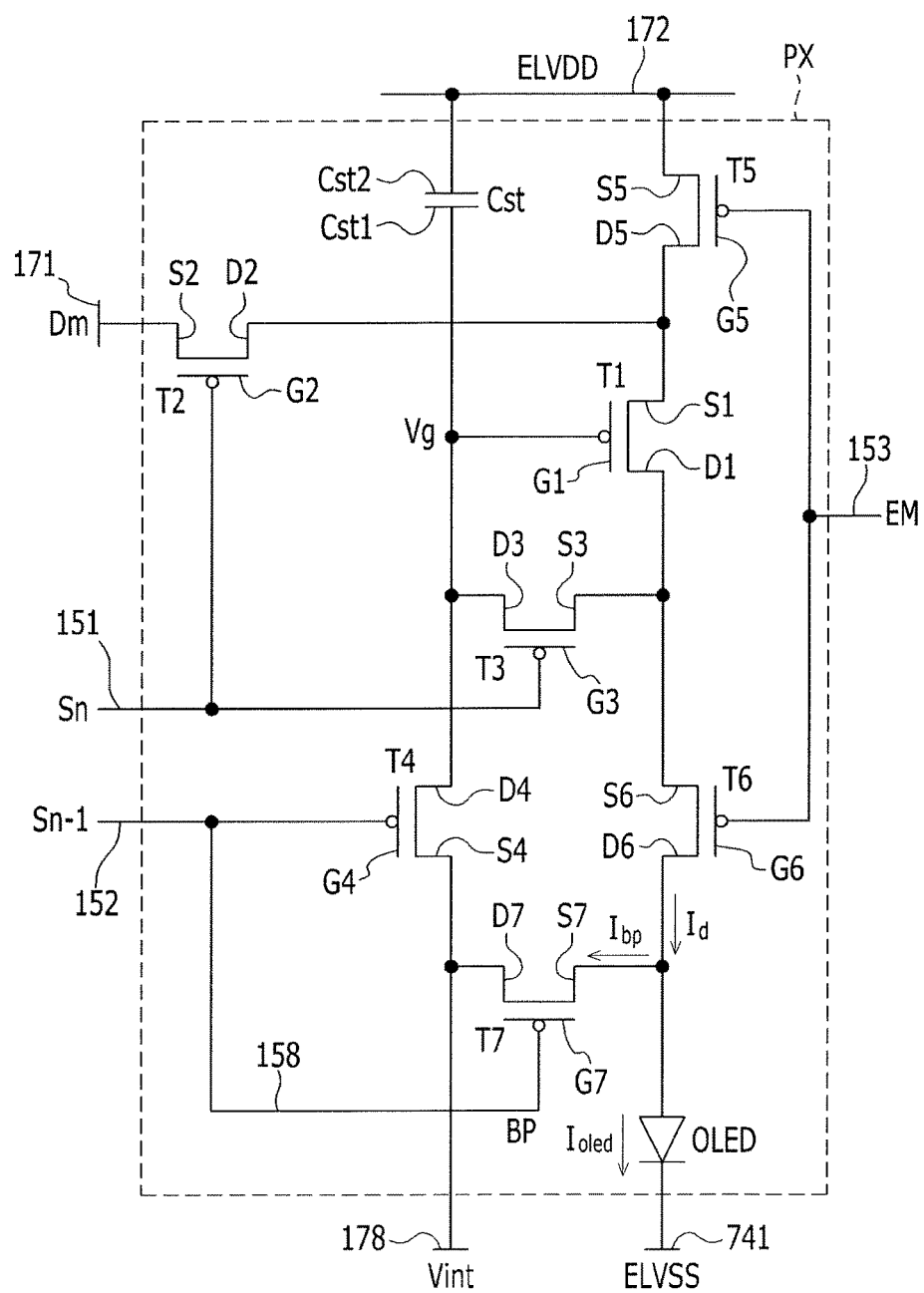
FIG. 2 illustrates an embodiment of a pixel.

FIG. 2 illustrates an embodiment of a pixel which may be representative of the pixels in the organic light emitting diode display. This embodiment includes a plurality of signal lines and a plurality of pixels PX connected to the signal lines and arranged in an approximate matrix. The pixel PX includes a plurality of transistors, a storage capacitor, and an organic light emitting diode OLD connected to the plurality of signal lines. The transistors and the storage capacitor Cst form the pixel circuit portion PI.

The transistors include a driving transistor T1, a switching transistor T2, a compensation transistor T3, an initialization transistor T4, an operation control transistor T5, a light emission control transistor T6, and a bypass transistor T7.

The signal lines include a scan line 151 transferring a scan signal Sn, a previous scan line 152 transferring a previous scan signal Sn−1 to the initialization transistor T4, a light emission control line 153 transferring a light emission control signal EM to the operation control transistor T5 and the light emission control transistor T6, a bypass control line 158 transferring a bypass signal BP to the bypass transistor T7, a data line 171 crossing the scan line 151 and transferring a data signal Dm, a driving voltage line 172 transferring a driving voltage ELVDD and formed to be substantially parallel with the data line 171, and an initialization voltage line 178 transferring an initialization voltage Vint for initializing the driving transistor T1.

A gate electrode G1 of the driving transistor T1 is connected with one end Cst1 of the storage capacitor Cst, a source electrode S1 of the driving transistor T1 is connected with the driving voltage line 172 via the operation control transistor T5, and a drain electrode D1 of the driving transistor T1 is electrically connected with an anode of the organic light emitting diode OLD via the light emission control transistor T6. The driving transistor T1 receives the data signal Dm according to a switching operation of the switching transistor T2 to supply a driving current Id to the organic light emitting diode OLD.

A gate electrode G2 of the switching transistor T2 is connected with the scan line 151, a source electrode S2 of the switching transistor T2 is connected with the data line 171, and a drain electrode D2 of the switching transistor T2 is connected with the source electrode S1 of the driving transistor T1 and with the driving voltage line 172 via the operation control transistor T5. The switching transistor T2 is turned on according to the scan signal Sn received through the scan line 151 to perform a switching operation for transferring the data signal Dm transferred to the data line 171 to the source electrode of the driving transistor T1.

A gate electrode G3 of the compensation transistor T3 is directly connected with the scan line 151, a source electrode S3 of the compensation transistor T3 is connected to the drain electrode D1 of the driving transistor T1 and with an anode of the organic light emitting diode OLD via the emission control transistor T6, and a drain electrode D3 of the compensation transistor T3 is connected with one end Cst1 of the storage capacitor Cst and the drain electrode D4 of the initialization transistor T4, and the gate electrode G1 of the driving transistor T1 together. The compensation transistor T3 is turned on according to the scan signal Sn received through the scan line 151 to connect the gate electrode G1 and the drain electrode D1 of the driving transistor T1 and diode-connect the driving transistor T1.

A gate electrode G4 of the initialization transistor T4 is connected with the previous scan line 152, a source electrode S4 of the initialization transistor T4 is connected with an initialization voltage line 178, and a drain electrode D4 of the initialization transistor T4 is connected with one end Cst1 of the storage capacitor Cst and the gate electrode G1 of the driving transistor T1 together through the drain electrode D3 of the compensation transistor T3. The initialization transistor T4 is turned on according to a previous scan signal Sn−1 received through the previous scan line 152 to transfer the initialization voltage Vint to the gate electrode G1 of the driving transistor T1, and then to perform an initialization operation of initializing a voltage of the gate electrode G1 of the driving transistor T1.

A gate electrode G5 of the operation control transistor T5 is connected with the light emission control line 153, a source electrode S5 of the operation control transistor T5 is connected with the driving voltage line 172, and a drain electrode D5 of the operation control transistor T5 is connected with the source electrode S1 of the driving transistor T1 and the drain electrode S2 of the switching transistor T2.

A gate electrode G6 of the emission control transistor T6 is connected to the light emission control line 153, the source electrode S6 of the first emission control transistor T6 is connected to the drain electrode D1 of the driving transistor T1 and the source electrode S3 of the compensation transistor T3, and the drain electrode D6 of the first emission control transistor T6 is electrically connected to the anode of the organic light emitting diode OLD. The operation control transistor T5 and the first emission control transistor T6 are simultaneously turned on according to the emission control signal EM transmitted to the light emission control line 153 such that the driving voltage ELVDD is compensated through the diode-connected driving transistor T1 and is transmitted to the organic light emitting diode OLD.

A gate electrode G7 of the thin film bypass transistor T7 is connected to the bypass control line 158, a source electrode S7 of the bypass thin film transistor T7 is connected to the drain electrode D6 of the light emission control thin film transistor T6 and the anode of the organic light emitting diode OLD together, and a drain electrode D7 of the bypass thin film transistor T7 is connected to the initialization voltage line 178 and the source electrode S4 of the initialization thin film transistor T4 together. In this case, the bypass control line 158 is connected to the previous scan line 152 such that the bypass signal BP is the same as the previous scan signal S(n−1).

The other end Cst2 of the storage capacitor Cst is connected with the driving voltage line 172, and a cathode of the organic light emitting diode OLD is connected with a common voltage line 741 transferring a common voltage ELVSS.

The pixel in this embodiment has a 7T-1C (7-transistor and 1-capacitor) structure including the bypass transistor T7. The pixel may have a different structure in another embodiment.

Figure 3:
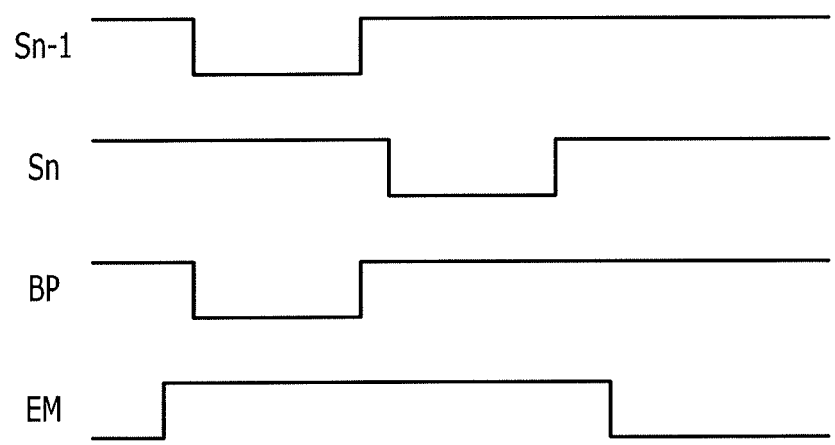
FIG. 3 illustrates an example of control signals for the display.

FIG. 3 is a timing diagram illustrating an example of control signals for the pixel. As shown in FIG. 3, first, in an initializing period, the previous scan signal S(n−1) having a low level is supplied through the previous scan line 152. Then, the initializing thin film transistor T4 is turned on based on the previous scan signal S(n−1) having the low level, the initial voltage Vint is connected to the gate electrode G1 of the driving transistor T1 from the initialization voltage line 178 through the initializing thin film transistor T4, and then the driving thin film transistor T1 is initialized by the initialization voltage Vint.

Thereafter, in a data programming period, the scan signal Sn having a low level is supplied through the scan line 151. Then, the switching thin film transistor T2 and the compensating thin film transistor T3 are turned on based on the scan signal Sn having the low level. At this time, the driving transistor T1 is diode-connected through the turned-on compensation transistor T3 and is biased in a forward direction.

Then, a compensation voltage Dm+Vth (Vth is a negative (−) value) reduced by a threshold voltage Vth of the driving thin film transistor T1 from a data signal Dm supplied from the data line 171 is applied to the gate electrode G1 of the driving thin film transistor T1. Thus, the gate voltage Vg applied to the gate electrode G1 of the driving transistor T1 becomes the compensation voltage (Dm+Vth). The driving voltage ELVDD and the compensation voltage (Dm+Vth) are applied to respective terminals of the storage capacitor Cst, and a charge corresponding to a voltage difference between the terminals is stored in the storage capacitor Cst.

In the emission period, the emission control signal EM from the emission control line 153 is changed from the high level into the low level. Thus, the operation control transistor T5 and the emission control transistor T6 are turned on by the emission control signal EM of the low level during the emission period.

Therefore, a driving current Id is generated based on the voltage difference between the gate voltage of the gate electrode G1 of the driving transistor T1 and the driving voltage ELVDD. The driving current Id is supplied to the organic light emitting diode OLD through the emission control transistor T6. The gate-source voltage Vgs of the driving thin film transistor T1 is maintained as "(Dm+Vth)−ELVDD" by the storage capacitor Cst for the emission period. According to a current-voltage relationship of the driving thin film transistor T1, the driving current Id is proportional to the square "(Dm−ELVDD)2" of a value obtained by subtracting the threshold voltage from the source-gate voltage. Accordingly, the driving current Id is determined regardless of the threshold voltage Vth of the driving thin film transistor T1.

The bypass transistor T7 is controlled by the bypass signal BP from the bypass control line 158. Thus, the portion of the driving current Id is discharged as the bypass current Ibp through the bypass transistor T7.

When a minimum current of the driving transistor T1 for displaying a black image flows as the driving current, the black image will be displayed unless the organic light emitting diode (OLED) also emits light. To prevent this from occurring, in one embodiment, the bypass transistor T7 disperses the portion of the minimum current of the driving transistor T1 as the bypass current Ibp through another current path, beside the current path of the organic light emitting diode side.

The minimum current of the driving transistor T1 may correspond to current that flows when the driving transistor T1 is turned off, since the gate-source voltage Vgs of the driving transistor T1 is smaller than the threshold voltage Vth. The minimum driving current (for example, a current of 10 pA or less) that flows when the driving transistor T1 is turned off may be transferred to the organic light emitting diode OLD to express as an image with black luminance.

When the minimum driving current flows to express the black image, influence on bypass transfer of the bypass current Ibp may be large. However, when a large driving current flows to express a normal image or white image, there may be little influence on the bypass current Ibp. Accordingly, when the driving current flows to display a black image, the light emission current Ioled of the organic light emitting diode OLED, which is reduced by the current amount of the bypass current Ibp which flows out from the driving current Id through the bypass transistor T7, has a minimum current amount at a level to exactly express a black image. Therefore, a black luminance image may be implemented exactly using the bypass transistor T7, thereby improving a contrast ratio. In the embodiment of FIG. 2, the bypass signal BP may be the previous scan signal Sn−1.

Figure 4:
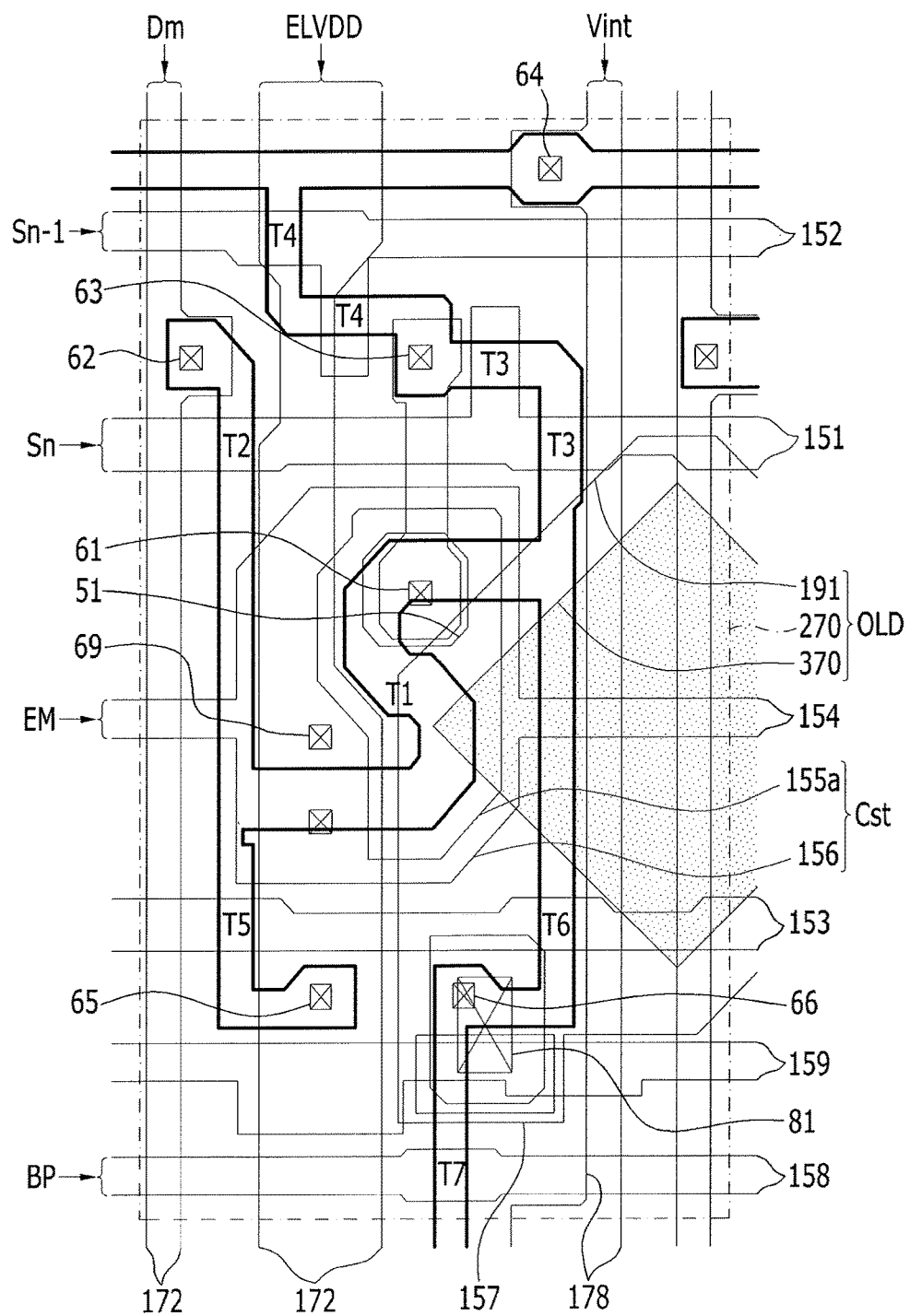
FIG. 4 illustrates a layout embodiment of a pixel.
Figure 5:
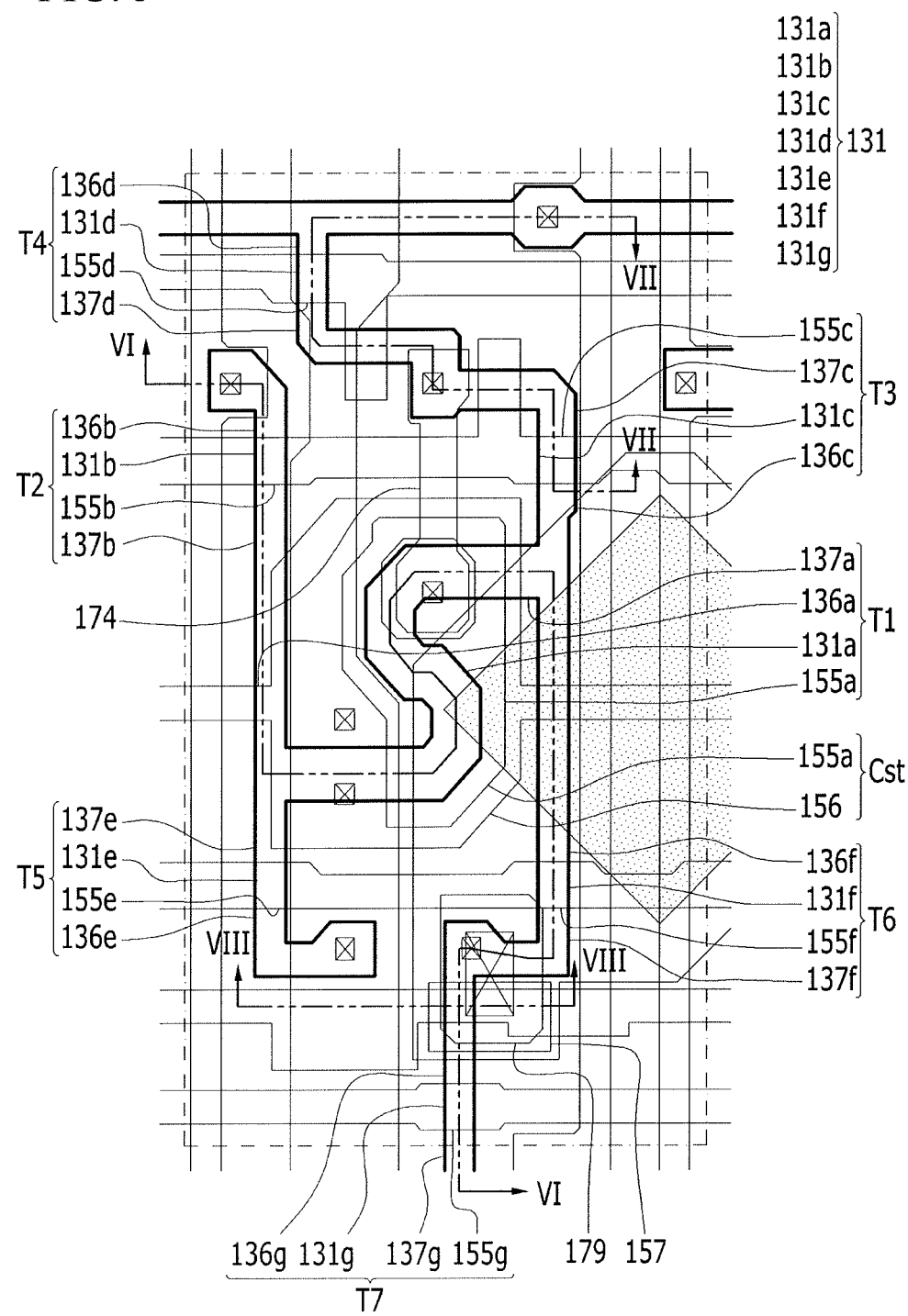
FIG. 5 illustrates a more detailed view of the pixel.
Figure 6:
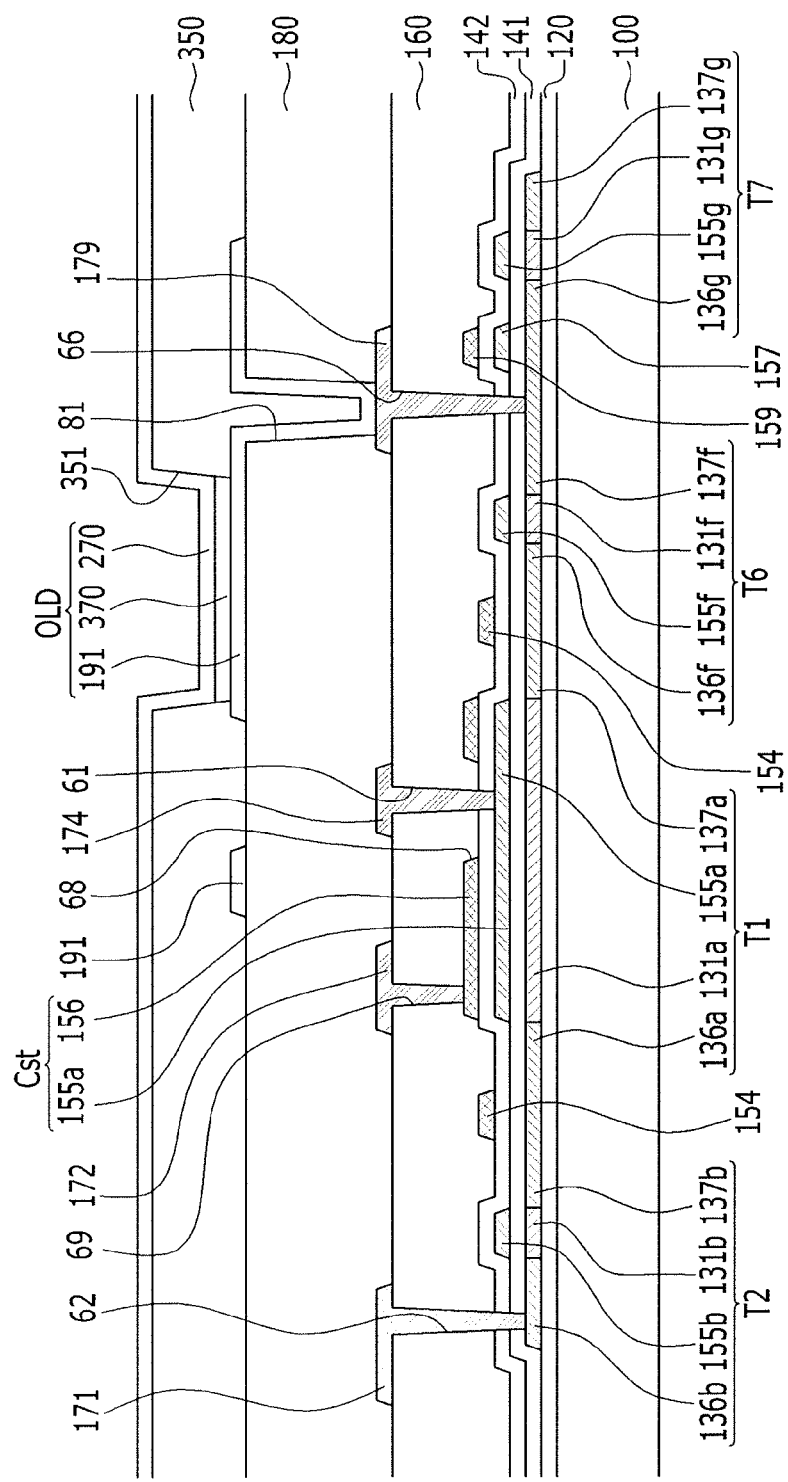
FIG. 6 illustrates a view of the pixel along section line VI-VI in FIG. 5.
Figure 7:
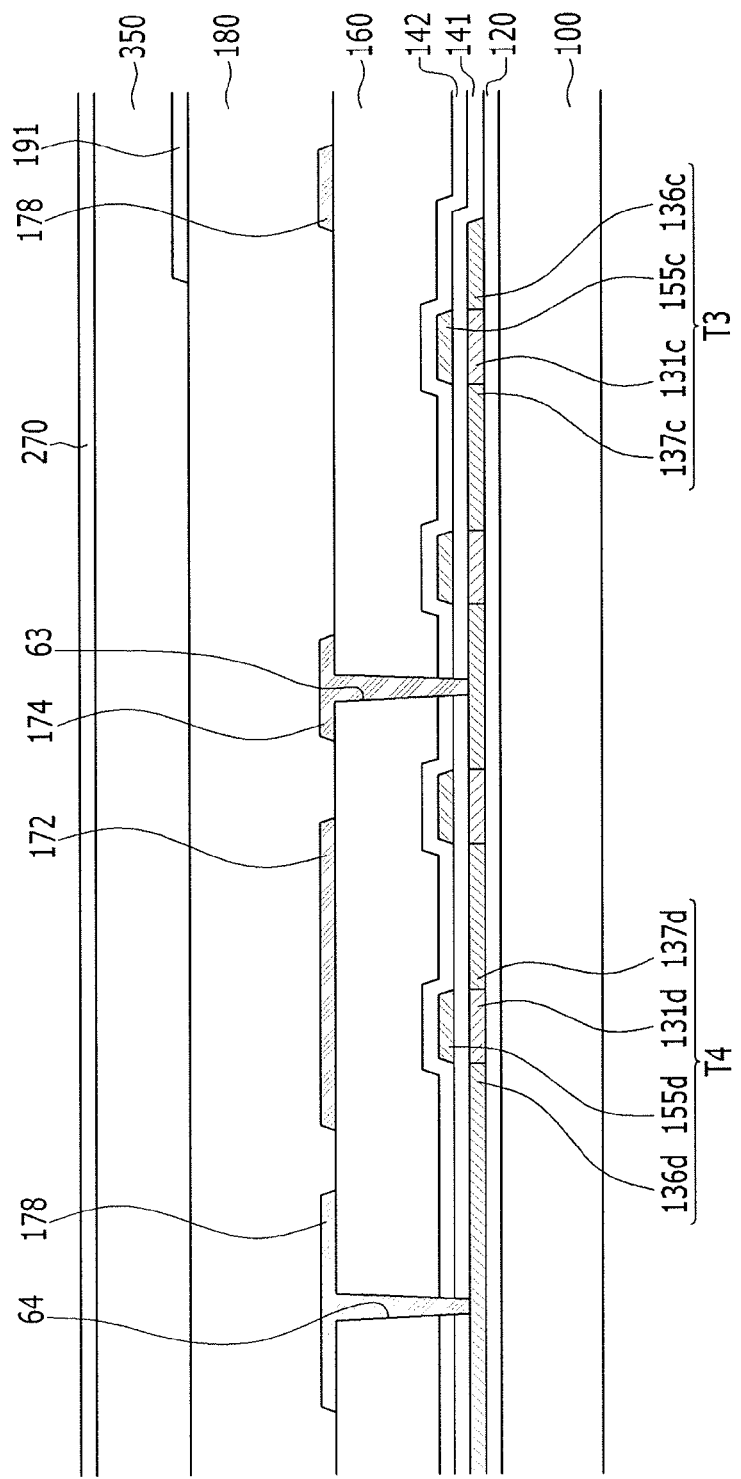
FIG. 7 illustrates a view of the pixel along section line VII-VII in FIG. 5.
Figure 8:
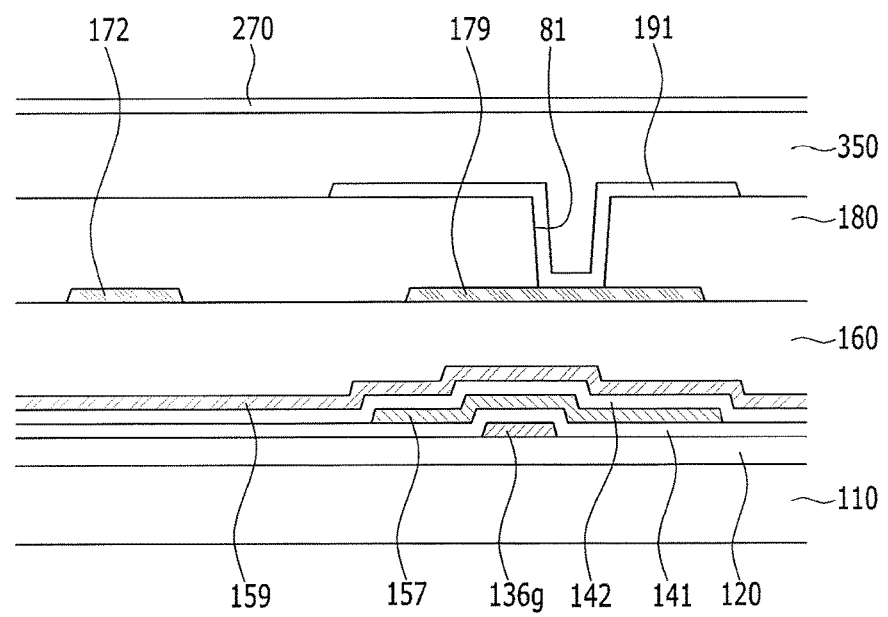
FIG. 8 illustrates a view of the pixel along section line VIII-VIII in FIG. 5.

FIG. 4 illustrates a layout embodiment of the pixel. FIG. 5 is a detailed layout view of FIG. 4. FIG. 6 is a cross-sectional view of the organic light emitting diode display of FIG. 5 taken along line VI-VI. FIG. 7 is a cross-sectional view of the organic light emitting diode display of FIG. 5 taken along line VII-VII. FIG. 8 is a cross-sectional view of the organic light emitting diode display of FIG. 5 taken along line VIII-VIII. A detailed planar structure of the organic light emitting diode display will be described with reference to FIG. 4 and FIG. 5, and a detailed cross-sectional structure will be described with reference to FIG. 6, FIG. 7, and FIG. 8.

As shown in FIG. 4, the pixel part P1 of the organic light emitting diode display includes the scan line 151, the previous scan line 152, the light emission control line 153, and the bypass control line 158 in a row direction for respectively transmitting a scan signal Sn, the previous scan signal Sn−1, an emission control signal EM, and the bypass signal BP to the pixel PX. The repair line 159 connected to the dummy circuit portion DI is parallel to the scan line 151.

The data line 171, the driving voltage line 172, and an initialization voltage line 178 crosses the scan line 151, the previous scan line 152, the emission control line 153, and the bypass control line 158 and respectively applies a data signal Dm, a driving voltage ELVDD, and an initialization voltage Vint to the pixel PX. The initialization voltage Vint is transmitted from the initialization voltage line 178 to the compensation transistor T3 via the initialization transistor T4.

The driving thin film transistor T1, the switching thin film transistor T2, the compensation thin film transistor T3, the initialization thin film transistor T4, the operation control thin film transistor T5, the emission control thin film transistor T6, the bypass thin film transistor T7, a storage capacitor Cst, and an organic light emitting diode OLD are formed in the pixel PX. The organic light emitting diode OLD includes a pixel electrode 191, an organic emission layer 370, and a common electrode 270. The compensation transistor T3 and the initialization transistor T4 may be configured as a dual gate structure transistor in order to block a leakage current.

Channels of the driving transistor T1, the switching transistor T2, the compensation transistor T3, the initialization transistor T4, the operation control transistor T5, the light emission control transistor T6, and the bypass transistor T7 are formed in one semiconductor 130 connected thereto. The semiconductor 130 may be curved in various shapes. The semiconductor 130 may include, for example, a polycrystalline semiconductor material or an oxide semiconductor material.

The oxide semiconductor material may include an oxide based on at least one of titanium (Ti), hafnium (Hf), zirconium (Zr), aluminum (Al), tantalum (Ta), germanium (Ge), zinc (Zn), gallium (Ga), tin (Sn), or indium (In), and indium-gallium-zinc oxide (InGaZnO$_4$), indium-zinc oxide (Zn—In—O), zinc tin oxide (Zn—Sn—O), indium-gallium oxide (In—Ga—O), indium-tin oxide (In—Sn—O), indium-zirconium oxide (In—Zr—O), indium-zirconium-zinc oxide (In—Zr—Zn—O), indium-zirconium-tin oxide (In—Zr—Sn—O), indium-zirconium-gallium oxide (In—Zr—Ga—O), indium aluminum oxide (In—Al—O), indium-zinc-aluminum oxide (In—Zn—Al—O), indium-tin-aluminum oxide (In—Sn—Al—O), indium-aluminum-gallium oxide (In—Al—Ga—O), indium-tantalum oxide (In—Ta—O), indium-tantalum-zinc oxide (In—Ta—Zn—O), indium-tantalum-tin oxide (In—Ta—Sn—O), indium-tantalum-gallium oxide (In—Ta—Ga—O), indium-germanium oxide (In—Ge—O), indium-germanium-zinc oxide (In—Ge—Zn—O), indium-germanium-tin oxide (In—Ge—Sn—O), indium-germanium-gallium oxide (In—Ge—Ga—O), titanium-indium-zinc oxide (Ti—In—Zn—O), or hafnium-indium-zinc oxide (Hf—In—Zn—O) which is a compound oxide thereof. When the semiconductor 130 includes an oxide semiconductor material, a separate passivation layer for protecting the oxide semiconductor material, which is vulnerable to an external environment such as a high temperature, may be added.

The semiconductor 130 includes a channel 131 doped with an N-type impurity or a P-type impurity, and a source doping part and a drain doping part formed at respective sides of the channel and doped with a doping impurity opposite to the doping impurity of the channel. In the exemplary embodiment, the source doping part and the drain doping part correspond to the source electrode and the drain electrode, respectively. The source electrode and the drain electrode formed in the semiconductor 130 may be formed by doping only the corresponding regions. Further, in the semiconductor 130, a region between source electrodes and drain electrodes of different transistors is doped. Thus, the source electrode and the drain electrode may be electrically connected to each other.

As illustrated in FIG. 3, the channel 131 includes a driving channel 131a in the drive transistor T1, a switching channel 131b in the switching transistor T2, a compensation channel 131c in the compensation transistor T3, an initialization channel 131d in the initialization transistor T4, an operation control channel 131e in the operation control transistor T5, a light emission control channel 131f in the light emission control transistor T6, and a bypass channel 131g in the bypass transistor T7.

The driving transistor T1 includes the driving channel 131a, a driving gate electrode 155a, the driving source electrode 136a, and a driving drain electrode 137a. The driving channel 131a is curved and may have a meandering shape or a zigzag shape. As such, by forming the curved driving channel 131a, the driving channel 131a may be elongated in a narrow space. The driving range of the driving gate-source voltage Vgs between the driving gate electrode 155a and the driving source electrode 136a is increased by the elongated driving channel 131a.

Since the driving range of the gate voltage is increased, the grayscale value of light emitted from the organic light emitting diode OLD may be finely controlled by changing the magnitude of the gate voltage. As a result, the resolution of the organic light emitting diode display device may be enhanced and display quality may be improved. Various examples of the curved shape of the driving channel 131a include a reverse S, S. M, and W shapes.

The driving gate electrode 155a overlaps the driving channel 131a, and the driving source electrode 136a and the driving drain electrode 137a are closely formed at respective sides of the driving channel 131a. The driving gate electrode 155a is connected to a first data connecting member 174 through a contact hole 61.

The switching transistor T2 includes the switching channel 131b, a switching gate electrode 155b, a switching source electrode 136b, and a switching drain electrode 137b. The switching gate electrode 155b is a part extending downward from the scan line 121 to overlap the switching channel 131b. The switching source electrode 136b and the switching drain electrode 137b are closely formed at respective sides of the switching channel 131b. The switching source electrode 136b is connected with the data line 171 through a contact hole 62.

The compensation transistor T3 includes the compensation channel 131c, a compensation gate electrode 155c, a compensation source electrode 136c, and a compensation drain electrode 137c.

Two compensation transistors T3 are formed in order to prevent leakage current, and two compensation gate electrodes 155c may respectively correspond to a portion of the scan line 151 and a protrusion extending upwardly from the scan line 151. The compensation gate electrode 155c overlaps the compensation channel 131c, and the compensation source electrode 136c and the compensation drain electrode 137c are formed to be adjacent to respective sides of the compensation channel 131c. The compensation drain electrode 137c is connected to the driving connecting member 174 through a contact hole 63.

The initialization transistor T4 includes the initialization channel 131d, an initialization gate electrode 155d, an initialization source electrode 136d, and an initialization drain electrode 137d. Two initialization transistors T4 are formed in order to prevent leakage current. Two initialization gate electrodes 155d may respectively be a portion of the previous scan line 152 and a protrusion extended downwardly from the previous scan line 152. The initialization gate electrode 155d overlaps the initialization channel 131d. The initialization source electrode 136d and the initialization drain electrode 137d are formed to be adjacent to respective sides of the initialization channel 131d. The initialization source electrode 136d is connected to the initialization connecting member 175 through a contact hole 64, and the initialization drain electrode 137d is connected to the driving connecting member 174 through the contact hole 63.

The operation control transistor T5 includes the operation control channel 131e, an operation control gate electrode 155e, an operation control source electrode 136e, and an operation control drain electrode 137e. The operation control gate electrode 155e is a part of the light emission control line 153 and overlaps the operation control channel 131e. The operation control source electrode 136e and the operation control drain electrode 137e are closely formed at respective sides of the operation control channel 131e. The operation control source electrode 136e is connected with a part of the driving voltage line 172 through a contact hole 65.

The light emission control transistor T6 includes the light emission control channel 131f, a light emission control gate electrode 155f, a light emission control source electrode 136f, and a light emission control drain electrode 137f. The light emission control gate electrode 155f is a part of the light emission control line 153 and overlaps the light emission control channel 131f. The emission control source electrode 136f and the emission control drain electrode 137f are closely formed at respective sides of the emission control channel 131f. The light emission control drain electrode 137f is connected with an emission control connecting member 179 through a contact hole 66.

The bypass transistor T7 includes the bypass channel 131g, a bypass gate electrode 155g, a bypass source electrode 136g, and a bypass drain electrode 137g. The bypass gate electrode 155g which is a part of the bypass control line 158 overlaps with the bypass channel 131g, and the bypass source electrode 136g and the bypass drain electrode 137g are formed at respective sides of the bypass channel 131g to be close. The bypass source electrode 136g is connected to the emission control connecting member 179 through the emission control contact hole 66, and the bypass drain electrode 137g is connected directly to the initialization source electrode 136d.

One end of the driving channel 131a of the driving transistor T1 is connected to the switching drain electrode 137b and the operation control drain electrode 137e. The other end of the driving channel 131a is connected to the compensation source electrode 136c and the emission control source electrode 136f.

The storage capacitor Cst includes the first storage electrode 155a and a second storage electrode 156 with a second insulating layer 142 therebetween. The first storage electrode 155a corresponds to the driving gate electrode 155a. The second storage electrode 156 is a portion extending from a storage line 154, occupies a larger area than the driving gate electrode 155a, and fully covers the driving gate electrode 155a. The second insulating layer 142 includes a dielectric material and a storage capacitance is determined by charges stored in the storage capacitor Cst and a voltage between the two electrodes 155a and 156. As such, the driving gate electrode 155a is used as the first storage electrode 155a. As a result, it is possible to ensure a space in which the storage capacitor may be formed within a space narrowed by the driving channel 131a having a large area in the pixel.

The first storage electrode 155a, which is the driving gate electrode 155a, is connected with one end of the first data connecting member 174 through the contact hole 61 and a storage opening 51. The storage opening 51 is formed in the second storage electrode 156.

The first data connection member 174 is formed on the same layer as and to be substantially parallel with the data line 171. The other end of the first data connection member 174 is connected with the second compensation drain electrode 137c of the second compensation transistor T3 and the second initialization drain electrode 137d of the second initialization transistor T4 through the contact hole 63. Accordingly, the first data connection member 174 connects the driving gate electrode 155a and the second compensation drain electrode 137c of the second compensation transistor T3, and the second initialization drain electrode 137d of the second initialization transistor T4, to each other.

The second storage electrode 156 is connected with the driving voltage line 172 through a contact hole 69. The storage capacitor Cst has a storage capacitance corresponding to a difference between the driving voltage ELVDD transferred to the second storage electrode 156 through the driving voltage line 172 and the gate voltage Vg of the driving gate electrode 155a.

The initialization voltage line 178 extends parallel to the data line 171 and is connected to the initialization source electrode 176d through the contact hole 64.

A first shorting assistance member 157 partially overlaps the repair line 159, which partially overlaps the emission control connecting member 179. The first shorting assistance member 157 is formed under the repair line 159 while overlapping the portion of the repair line 159. The emission control connecting member 179 is formed on the repair line 159 while overlapping the portion of the repair line 159. Accordingly, the portion of the repair line 159 overlaps both the first shorting assistance member 157 and the emission control connecting member 179.

In a laser repair process, a shorting part 10 may be formed between the repair line 159 and the emission control connecting member 179 using a laser beam L. During this process, the shorting part 10 may also be formed between the repair line 159 and the first shorting assistance member 157. When this occurs, a chain reaction takes place which allows the shorting part 10 to be easily formed between the repair line 159 and the emission control connecting member 179 using a low-energy laser beam.

Because the laser repair process may be performed using a low-energy laser beam, damage near the shorting part may be reduced or prevented. As a result, the success rate of the laser repair process may be improved. The energy range of the low-energy laser beam may be 1.5 mJ-2 mJ.

The emission control connecting member 179 may have a quadrangle shape and is connected to the pixel electrode 191 through a contact hole 81. Hereinafter, cross-sectional structures of the pixel unit and the peripheral unit in an organic light emitting diode display device according to various embodiments will be described with reference to FIG. 6, FIG. 7, and FIG. 8. In these cases, the operation control transistor T5 may have a stacked structure like the light emission control transistor T6.

A buffer layer 120 may be formed on an insulating substrate 110. The insulating substrate 110 may include an insulating material such as glass, crystal, ceramic, or plastic. The buffer layer 120 blocks impurities from the insulating substrate 110 during a crystallization process for forming a polycrystalline semiconductor, in order to improve characteristics of the polycrystalline semiconductor and reduce stress applied to the insulating substrate 110.

The semiconductor 130 including the driving channel 131a, the switching channel 131b, the compensation channel 131c, the initialization channel 131d, the operation control channel 131e, the light emission control channel 131f, and the bypass channel 131g is formed on the buffer layer 120. A driving source electrode 136a and a driving drain electrode 137a are formed on respective sides of the driving channel 131a in the semiconductor 130. A switching source electrode 136b and a switching drain electrode 137b are formed on respective sides of the switching channel 131b. The compensation source electrode 136c and the compensation drain electrode 137c are formed at respective sides of the compensation channel 131c. The initialization source electrode 136d and the initialization drain electrode 137d are formed at respective sides of the initialization channel 131d. The operation control source electrode 136e and the operation control drain electrode 137e are formed at respective sides of the operation control channel 131e. The emission control source electrode 136f and the emission control drain electrode 137f are formed at respective sides of the emission control channel 131f. The bypass source electrode 136g and the bypass drain electrode 137g are formed at respective sides of the bypass channel 131g.

A first gate insulating layer 141, as a first insulating layer covering the semiconductor 130, is formed on the semiconductor 130. First gate wires are formed on the first gate insulating layer 141. The first gate wires include a scan line 151 including a switching gate electrode 155b and a compensation gate electrode 155c, a previous scan line 152 including an initialization gate electrode 155d, an emission control line 153 including an operation control gate electrode 155e and an emission control gate electrode 155f, a bypass control line 158 including a bypass gate electrode 155g, a driving gate electrode (a first storage electrode) 155a, and a first shorting assistance member 157. The first gate wires may be formed of a material such as a metal layer including one of molybdenum (Mo), aluminum (Al), aluminum alloys, and molybdenum alloys.

A second gate insulating layer 142 as a second insulating layer is formed on the first gate wires 151, 152, 153, 155a, 155b, 155c, 155d, 155e, 155f, 157, and 158 and the first gate insulating layer 141. The first gate insulating layer 141 and the second gate insulating layer 142 may include, for example, a silicon nitride (SiNx) or a silicon oxide (SiOx).

Second gate wires are formed on the second gate insulating layer 142. The second gate wires include a storage line 154 parallel to the scan line 151, a second storage electrode 156 at a part extending from the storage line 154, and a repair line 159 parallel to the scan line 151 are formed.

An interlayer insulating layer 160 as a third insulating layer is formed on the second gate insulating layer 142 and the second gate wires 154, 156, and 159. The interlayer insulating layer 160 may include, for example, silicon nitride (SiNx) or a silicon oxide (SiOx).

The interlayer insulating layer 160 has contact holes 61, 62, 63, 64, 65, 66, and 69. Data wires are formed on the interlayer insulating layer 160. The data wires include a data line 171, a driving voltage line 172, a driving connecting member 174, an initialization voltage line 178, and an emission control connecting member 179 are formed.

The data line 171 is connected to the switching source electrode 136b through the contact hole 62 in the first gate insulating layer 141, the second gate insulating layer 142, and the interlayer insulating layer 160. One end of the driving connecting member 174 is connected to the first storage electrode 155a through the contact hole 61 in the second gate insulating layer 142 and the interlayer insulating layer 160. The other end of the driving connecting member 174 is connected to the compensation drain electrode 137c and the initialization drain electrode 137d through the contact hole 63 in the first gate insulating layer 141, the second gate insulating layer 142, and the interlayer insulating layer 160.

The initialization voltage line 178 is connected to the initialization source electrode 136d through the contact hole 64 in the first gate insulating layer 141, the second gate insulating layer 142, and the interlayer insulating layer 160.

The emission control connecting member 179 is connected to the emission control drain electrode 137f through the contact hole 66 in the first gate insulating layer 141, the second gate insulating layer 142, and the interlayer insulating layer 160.

The data wires 171, 172, 174, 178, and 179 may be formed, for example, of a triple layer of titanium/aluminum/titanium (Ti/Al/Ti), molybdenum/aluminum/molybdenum (Mo/Al/Mo), or molybdenum/copper/molybdenum (Mo/Cu/Mo).

A passivation layer 180 may be formed to cover the data wires 171, 172, 174, 178, and 179 and the interlayer insulating layer 160. The passivation layer 180 may include, for example, an organic layer.

A pixel electrode 191 is on the passivation layer 180. The emission control connecting member 179 is connected to the pixel electrode 191 through the contact hole 81 in the passivation layer 180.

A pixel defined layer (PDL) 350 covering the passivation layer 180 and the pixel electrode 191 is formed on edges of the passivation layer 180 and the pixel electrode 191. The pixel defined layer 350 has a pixel opening 351 that exposes the pixel electrode 191. The pixel defined layer 350 may include, for example, one or more resins such as polyacrylate resin and polyimides or one or more silica-series inorganic materials.

The organic emission layer 370 is formed on the pixel electrode 191 exposed by the pixel opening 351, and the common electrode 270 is formed on the organic emission layer 370. The common electrode 270 is formed on the pixel defined layer 350 to be formed through the plurality of pixels. As described above, the organic light emitting diode OLD is formed to include the pixel electrode 191, the organic emission layer 370, and the common electrode 270.

The pixel electrode 191 is an anode serving as a hole injection electrode and the common electrode 270 is a cathode serving as an electron injection electrode. In another embodiment, the pixel electrode 191 may be the cathode and the common electrode 270 may be the anode The configuration may depend, for example, on the driving method of the organic light emitting diode display. When holes and electrons are injected into the organic emission layer 370 from the pixel electrode 191 and the common electrode 270, respectively, excitons are formed. When the excitons fall from an excitation state to a ground state, light is emitted.

The organic emission layer 370 may include a low-molecular organic material or a high-molecular organic material such as poly(3,4-ethylenedioxythiophene) (PEDOT). The organic emission layer 370 may be formed of multiple layers including at least one of an emission layer, a hole injection layer (HIL), a hole transporting layer (HTL), an electron transporting layer (ETL), and an electron injection layer (EIL). When the organic emission layer 370 includes all of the layers, the hole injection layer is disposed on the pixel electrode 191 which is the positive electrode, and the hole transporting layer, the emission layer, the electron transporting layer, and the electron injection layer are sequentially laminated thereon.

The organic emission layer 370 may include a red organic emission layer emitting red light, a green organic emission layer emitting green light, and a blue organic emission layer emitting blue light, and the red organic emission layer, the green organic emission layer, and the blue organic emission layer are formed at a red pixel, a green pixel, and a blue pixel, respectively, to implement color images.

In the organic emission layer 370, all of the red organic emission layer, the green organic emission layer, and the blue organic emission layer are laminated together on the red pixel, the green pixel, and the blue pixel, and a red color filter, a green color filter, and a blue color filter are formed for each pixel to implement the color images. As another example, a white organic emission layer emitting white light is formed on all of the red pixel, the green pixel, and the blue pixel, and the red color filter, the green color filter, and the blue color filter are formed for each pixel to implement the color images. When the color images are implemented by using the white organic emission layer and the color filters, a deposition mask for depositing the red organic emission layer, the green organic emission layer, and the blue organic emission layer on individual pixels, that is, the red pixel, the green pixel, and the blue pixel, respectively, may not be used.

In other examples, the white organic emission layer may be formed by one organic emission layer or may emit white light by laminating a plurality of organic emission layers. As an example, the white organic emission layer may include a configuration that enables the white light to be emitted by combining at least one yellow organic emission layer and at least one blue organic emission layer, a configuration that enables the white light to be emitted by combining at least one cyan organic emission layer and at least one red organic emission layer, a configuration that enables the white light to be emitted by combining at least one magenta organic emission layer and at least one green organic emission layer, and the like.

An encapsulation member to protect the organic light emitting diode OLED may be formed on the common electrode 270. The encapsulation member may be sealed to the substrate 110 by a sealant and may include various materials such as glass, quartz, ceramic, plastic, or metal. A thin film encapsulation layer may be formed on the common electrode 270 by depositing the inorganic layer and the organic layer with the usage of the sealant.

Figure 9:
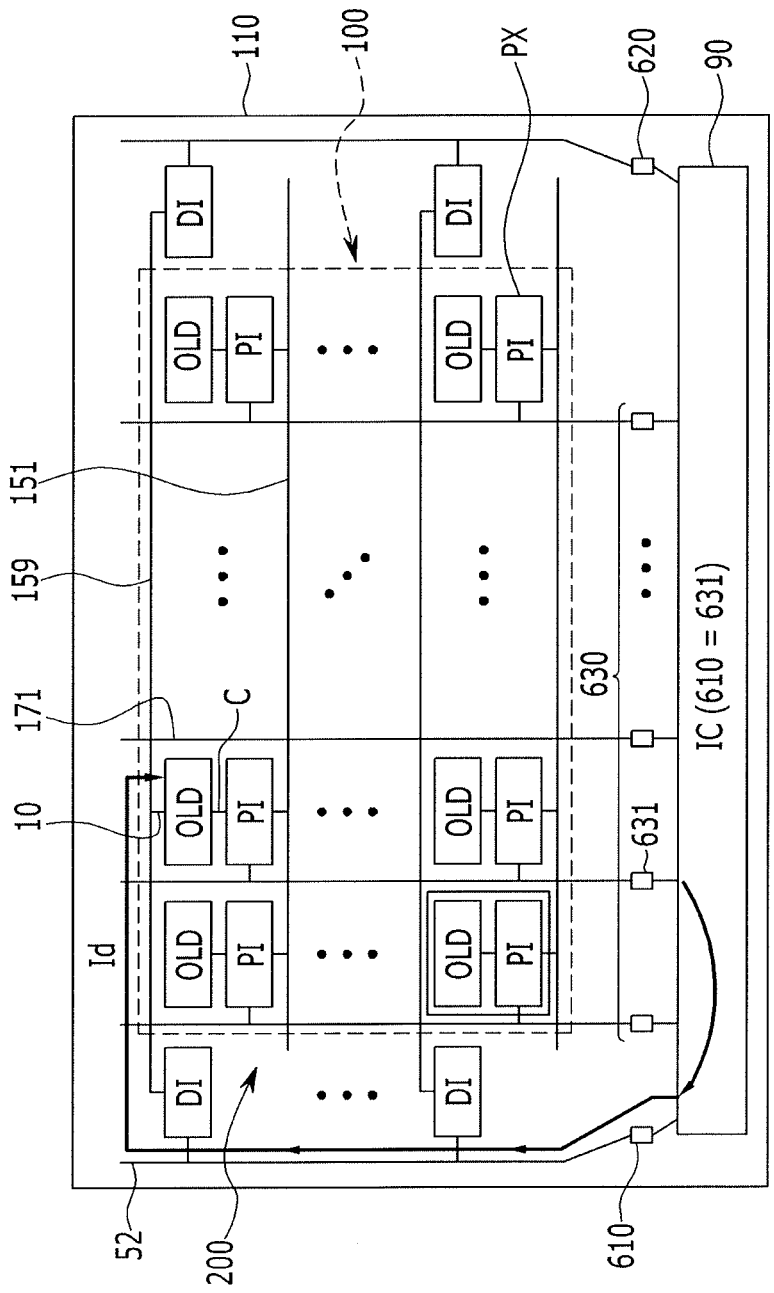
FIG. 9 illustrates a display relating to an embodiment of a repair method.
Figure 10:
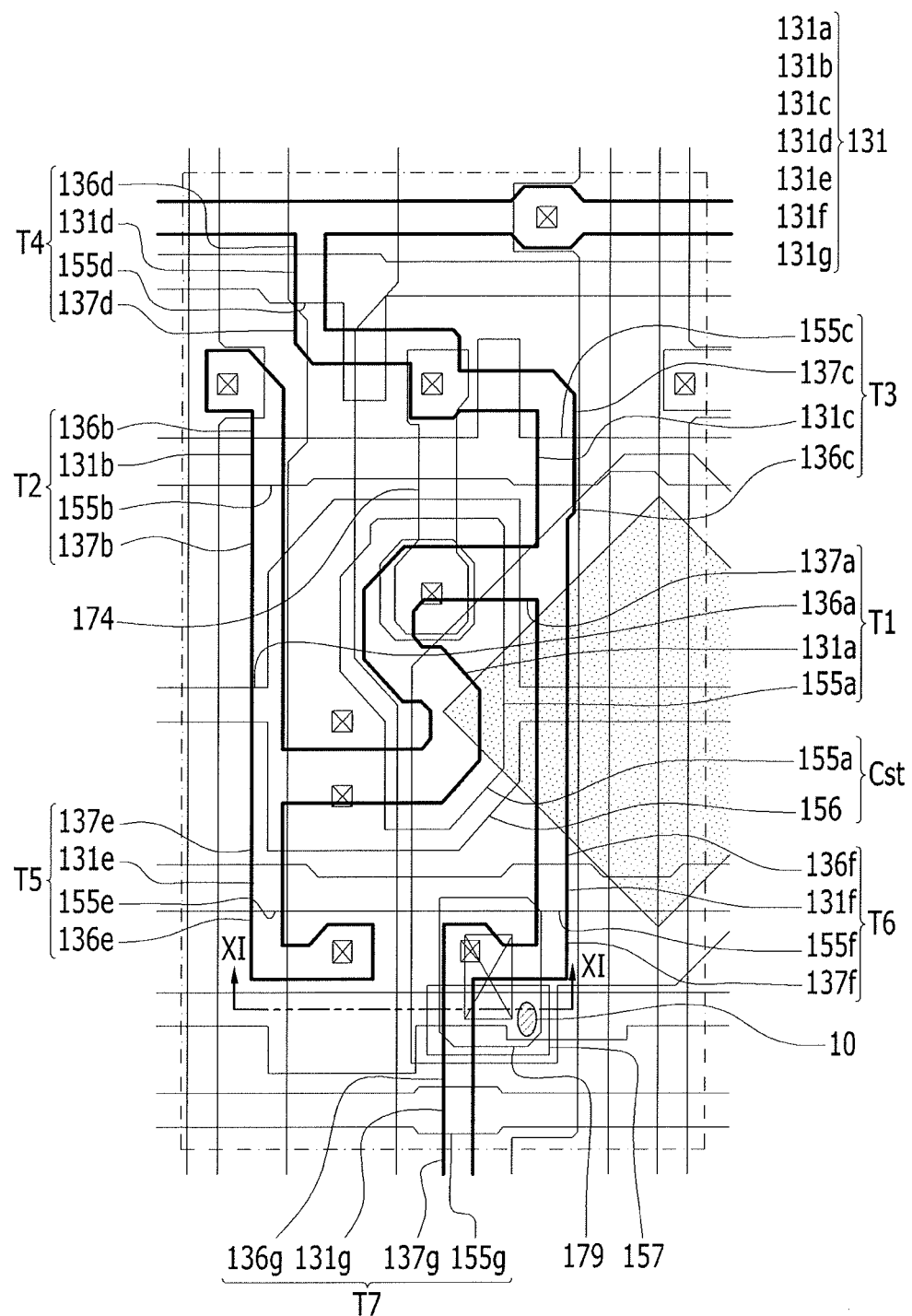
FIG. 10 illustrates a pixel layout relating to the repair method.
Figure 11:
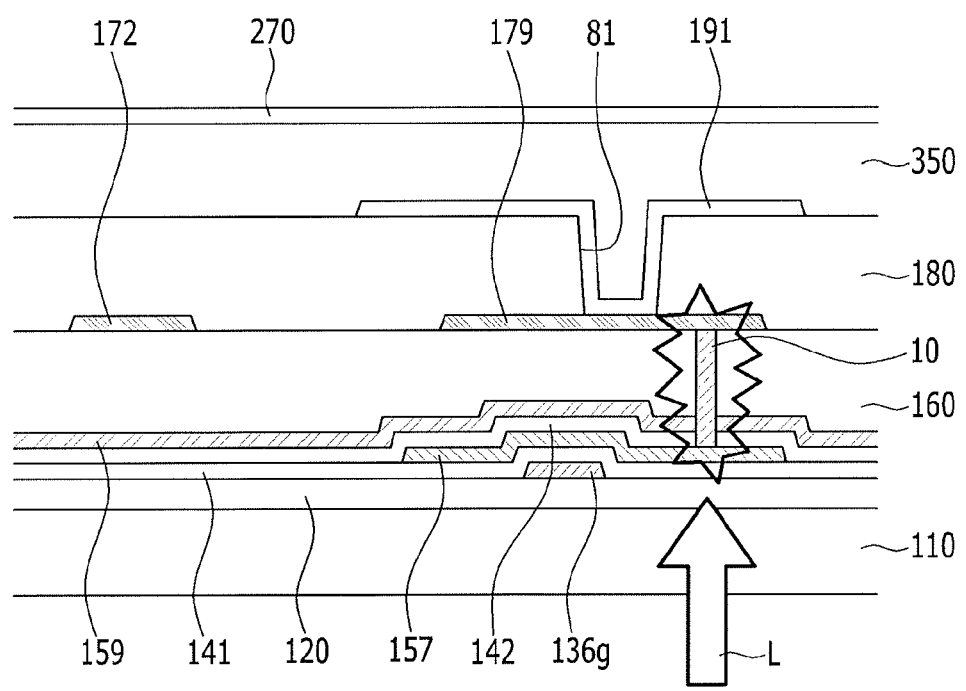
FIG. 11 illustrates a view of the pixel circuit along section line XI-XI in FIG. 10.

FIG. 9 illustrates an embodiment of a repair method of an organic light emitting diode display. FIG. 10 illustrates a layout view showing a state that a pixel circuit portion and an organic light emitting diode are isolated in one pixel of FIG. 9 and an emission control connecting member and a repair line are short-circuited using a laser beam. FIG. 11 is a cross-sectional view taken along a line XI-XI of FIG. 10.

As shown in FIG. 9, the repair method includes detecting a pixel failure of the organic light emitting diode display. The pixel failure may be detected, for example, by visual inspection or electronic inspection.

Next, the pixel circuit portion PI and the organic light emitting diode OLD in the detected failed pixel are isolated from each other. Here, the wires C connecting the pixel circuit portion PI and the organic light emitting diode OLD are cut using a laser. As shown in FIG. 10, since the emission control drain electrode 137f of the emission control transistor T6 of the pixel circuit portion PI is connected to the organic light emitting diode OLD through the emission control connecting member 179, the pixel circuit portion PI and the organic light emitting diode OLD may be isolated by cutting the emission control drain electrode 137f corresponding to the wires C.

Next, the repair line 159 at the failed pixel among the plurality of repair lines 159 is short-circuited to the organic light emitting diode OLD of the failure pixel. In this case, the laser repair process of short-circuiting the repair line 159 and the organic light emitting diode OLD is performed using the laser beam L.

For example, as shown in FIG. 11, the emission control connecting member and the repair line of the failed pixel are short-circuited using the laser beam L by the laser repair process. In this case, the portion of the repair line 159 overlaps the first shorting assistance members 157 and the emission control connecting member 179 when using the laser beam L to form the shorting part 10 in the interlayer insulating layer 160 between the repair line 159 and the emission control connecting member 179. A chain reaction is generated while the shorting part 10 is also formed in the second gate insulating layer 142 between the repair line 159 and the first shorting assistance member 157. The chain reaction allows the shorting part 10 to be easily formed between the repair line 159 and the emission control connecting member 179 with a low-energy laser beam.

Next, by using the driving circuit 90, the data signal Dm that is the same data signal transmitted to a driving pad 631 connected to the failed pixel is transmitted to the dummy driving pads 610 and 620 connected to the dummy circuit portion DI. To prevent the transmitting path of the data signal from being elongated, the repair process may be performed using a surrounding repair line 52 connected to the left dummy driving pad 610 in the failed pixel at the left side of the display unit 100 and a surrounding repair line 52 connected to the right dummy driving pad 620 in the failed pixel at the right side of the display unit 100.

Accordingly, the data signal passing through the dummy driving pads 610 and 620 is transmitted to the dummy circuit portion DI through the second dummy line 52. The driving current generated in the dummy circuit portion DI is transmitted to the organic light emitting diode OLD through the repair line 159 so that the failed pixel is driven as a normal pixel. For example, as shown in FIG. 9, the data signal and the driving current according thereto are transmitted to the organic light emitting diode OLD through the repair path R.

As described above, the same data signal as the data signal transmitted to the failed pixel is transmitted to the dummy circuit portion DI through the driving circuit 90, the dummy driving pads 610 and 620, and the surrounding repair line 52. The driving current generated in the dummy circuit portion DI is transmitted to the organic light emitting diode OLD of the failed pixel through the repair line 159, so that the failed pixel is repaired and operates as a normal pixel.

In one exemplary embodiment, the repair line is formed on the second insulating layer and the first shorting assistance member is formed on the first insulating layer. The repair line may be formed on the first insulating layer and the first shorting assistance member may be formed on the second insulating layer in another embodiment.

Figure 12:
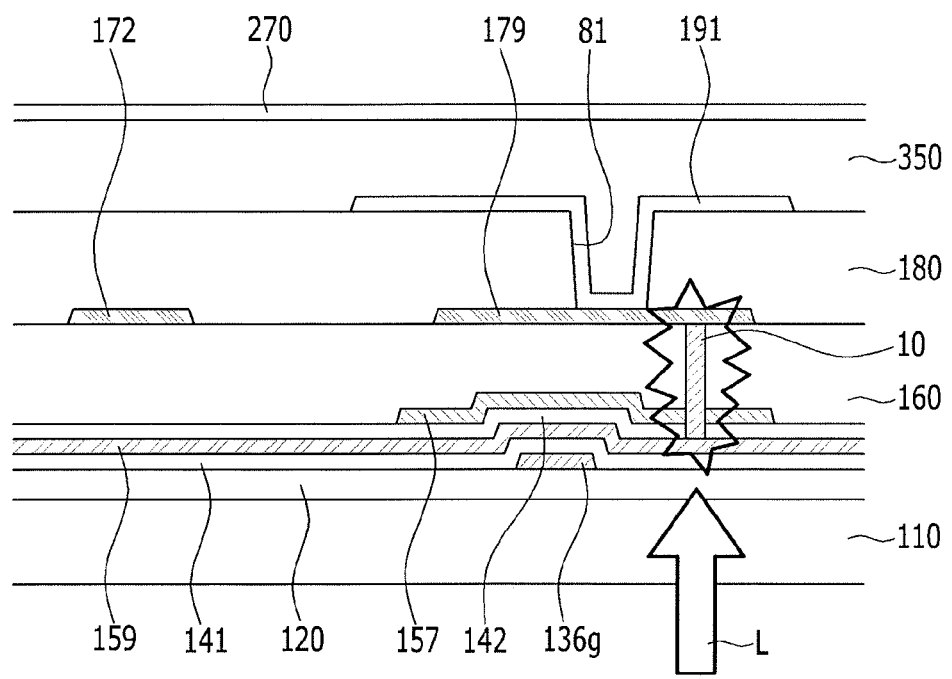
FIG. 12 illustrates another embodiment of a display.

FIG. 12 illustrates a cross-sectional view of another embodiment of an organic light emitting diode display. The exemplary embodiment in FIG. 12 is substantially the same as the exemplary embodiment in FIG. 1, FIG. 2, FIG. 3, FIG. 4, FIG. 5, FIG. 6, FIG. 7, and FIG. 8, except for the stacked position of the repair line and the first shorting assistance member.

As shown in FIG. 12, the semiconductor 130 including the bypass source electrode 136g is formed on the substrate 110, and the first gate insulating layer 141 covering the substrate 110 and the semiconductor 130 is formed thereon. The repair line 159 is formed on the first gate insulating layer 141. For example, the repair line 159 is formed with the same layer as the scan line 151. The second gate insulating layer 142 covering the first gate insulating layer 141 and the repair line 159 is formed thereon. The first shorting assistance member 157 is formed on the second gate insulating layer 142. The interlayer insulating layer 160 covering the second gate insulating layer 142 and the first shorting assistance member 157 is formed thereon. The emission control connecting member 179 is formed on the interlayer insulating layer 160. The emission control connecting member 179 is formed at the same layer as the data line 171 and the driving voltage line 172.

The first shorting assistance member 157 overlapping the portion of the repair line 159 is formed while overlapping the emission control connecting member 179. The first shorting assistance member 157 is formed on the repair line 159 overlapping the portion of the repair line 159. The emission control connecting member 179 is formed on the first shorting assistance member 157 while overlapping the portion of the repair line 159. Accordingly, the portion of the repair line 159 overlaps all of the first shorting assistance member 157 and the emission control connecting member 179.

When forming the shorting part 10 in the second gate insulating layer 142 and the interlayer insulating layer 160 between the repair line 159 and the emission control connecting member 179 by irradiating the laser beam L, a chain reaction is generated through the first shorting assistance member 157. As a result, the shorting part 10 is formed in the second gate insulating layer 142 and the interlayer insulating layer 160 between the repair line 159 and the emission control connecting member 179. The chain reaction allows the shorting part 10 to be easily formed between the repair line 159 and the emission control connecting member 179 using a low-energy laser beam L.

In one exemplary embodiment shown in FIG. 12, the emission control connecting member and the first shorting assistance member are separated from each other. In another embodiment, the shorting assistance part of the emission control connecting member may contact the first shorting assistance member through a shorting hole.

Figure 13:
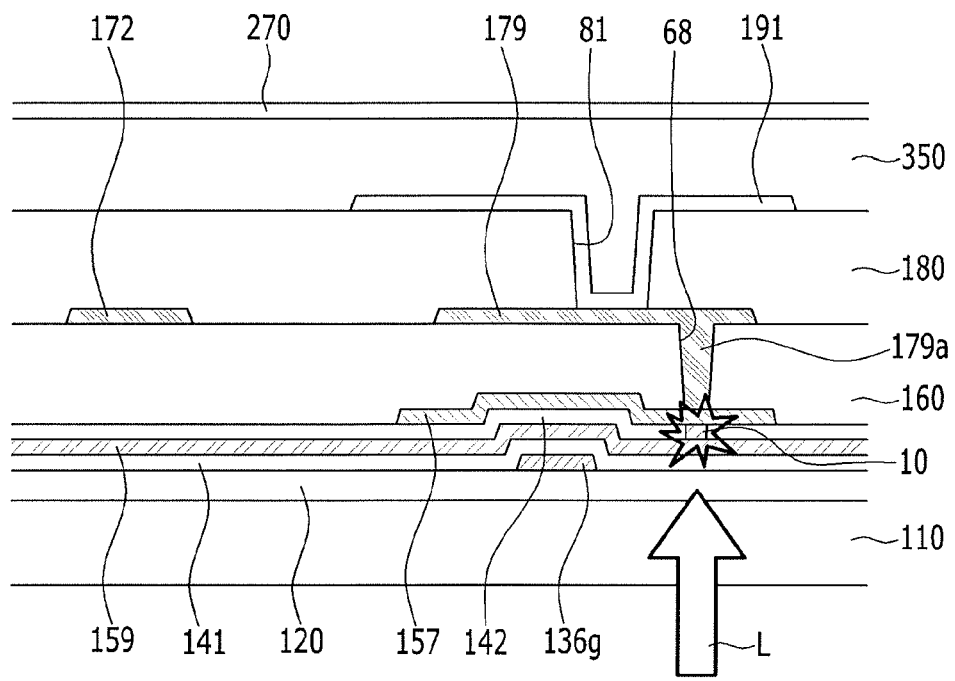
FIG. 13 illustrates another embodiment of a display.

FIG. 13 is a cross-sectional view of another embodiment of an organic light emitting diode display. The exemplary embodiment in FIG. 13 is substantially the same as the exemplary embodiment shown in FIG. 12, except for the shorting assistance part of the emission control connecting member in contact with the first shorting assistance member through the shorting hole.

As shown in FIG. 13, the semiconductor 130 including the bypass source electrode 136g is formed on the substrate 110, and the first gate insulating layer 141 covering the substrate 110 and the semiconductor 130 is formed thereon. The repair line 159 is formed on the first gate insulating layer 141. The second gate insulating layer 142 covering the first gate insulating layer 141 and the repair line 159 is formed thereon, and the first shorting assistance member 157 is formed on the second gate insulating layer 142. The interlayer insulating layer 160 covering the second gate insulating layer 142 and the first shorting assistance member 157 is formed thereon and the emission control connecting member 179 is formed on the interlayer insulating layer 160.

The interlayer insulating layer 160 has a shorting hole 68 for exposing the first shorting assistance member 157 and the emission control connecting member 179 has a shorting assistance part 179a filling the shorting hole 68. The shorting assistance part 179a of the emission control connecting member 179 is in contact with the first shorting assistance member 157 through the shorting hole 68.

When forming the shorting part 10 between the repair line 159 and the emission control connecting member 179 by irradiating the laser beam L, the emission control connecting member 179 is already in contact with the first shorting assistance member 157 through the shorting assistance part 179a. As a result, the shorting part 10 is only formed in the second gate insulating layer 142. As described above, if the shorting part 10 is only formed in the second gate insulating layer 142, the shorting part 10 may be easily formed between the repair line 159 and the emission control connecting member 179 using a low-energy laser beam L.

In one exemplary embodiment shown in FIG. 12, the first shorting assistance member overlapping the repair line is formed on the second gate insulating layer. In another embodiment, the second shorting assistance member may also be formed under the first gate insulating layer as well as the first shorting assistance member overlapping the repair line.

Figure 14:
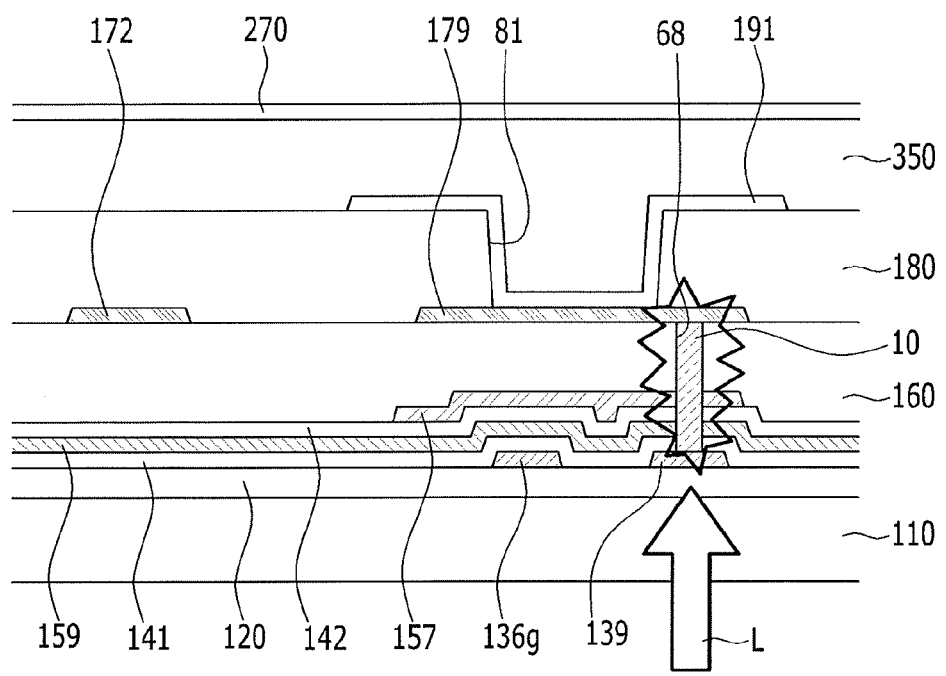
FIG. 14 illustrates another embodiment of a display.

FIG. 14 is a cross-sectional view of another embodiment of an organic light emitting diode display. The exemplary embodiment in FIG. 14 is substantially the same as the exemplary embodiment shown in FIG. 12, except for the second shorting assistance member.

As shown in FIG. 14, the semiconductor 130 including the bypass source electrode 136g and a second shorting assistance member 139 is formed on the substrate 110, and the first gate insulating layer 141 covering the substrate 110 and the semiconductor 130 is formed thereon. The repair line 159 is formed on the first gate insulating layer 141. For example, the repair line 159 is formed with the same layer as the scan line 151. The portion of the repair line 159 overlaps the second shorting assistance member 139. The second gate insulating layer 142 covering the first gate insulating layer 141 and the repair line 159 is formed thereon, and the first shorting assistance member 157 is formed on the second gate insulating layer 142. The interlayer insulating layer 160 covering the second gate insulating layer 142 and the first shorting assistance member 157 is formed thereon, and the emission control connecting member 179 is formed on the interlayer insulating layer 160. The emission control connecting member 179 is formed with the same layer as the data line 171 and the driving voltage line 172.

Here, the first shorting assistance member 157 and the second shorting assistance member 139 overlapping the portion of the repair line 159 are formed while overlapping the emission control connecting member 179. The first shorting assistance member 157 overlaps the portion of the repair line 159 and is formed on the repair line 159. The emission control connecting member 179 overlaps the portion of the repair line 159 and is formed on the first shorting assistance member 157. The second shorting assistance member 139 overlaps the portion of the repair line 159 and is formed under the repair line 159. Accordingly, the portion of the repair line 159 overlaps all of the first shorting assistance member 157, the second shorting assistance member 139, and the emission control connecting member 179.

When forming the shorting part 10 in the second gate insulating layer 142 and the interlayer insulating layer 160 between the repair line 159 and the emission control connecting member 179 by irradiating the laser beam L, a chain reaction is generated through the first shorting assistance member 157 and the second shorting assistance member 139. As a result, the shorting part 10 is formed in the first gate insulating layer 141 between the repair line 159 and the second shorting assistance member 139, as well as the second gate insulating layer 142 and the interlayer insulating layer 160 between the repair line 159 and the emission control connecting member 179. This chain reaction allows the shorting part 10 to be easily formed between the repair line 159 and the emission control connecting member 179 using a low-energy laser beam L.

In one exemplary embodiment shown in FIG. 1, FIG. 2, FIG. 3, FIG. 4, FIG. 5, FIG. 6. FIG. 7, and FIG. 8, the first shorting assistance member generating the chain reaction with the repair line overlaps the repair line. In another embodiment, the repair line having a repair hole may be formed to have the laser beam directly irradiated to the shorting assistance part of the emission control connecting member without the first shorting assistance member.

Figure 15:
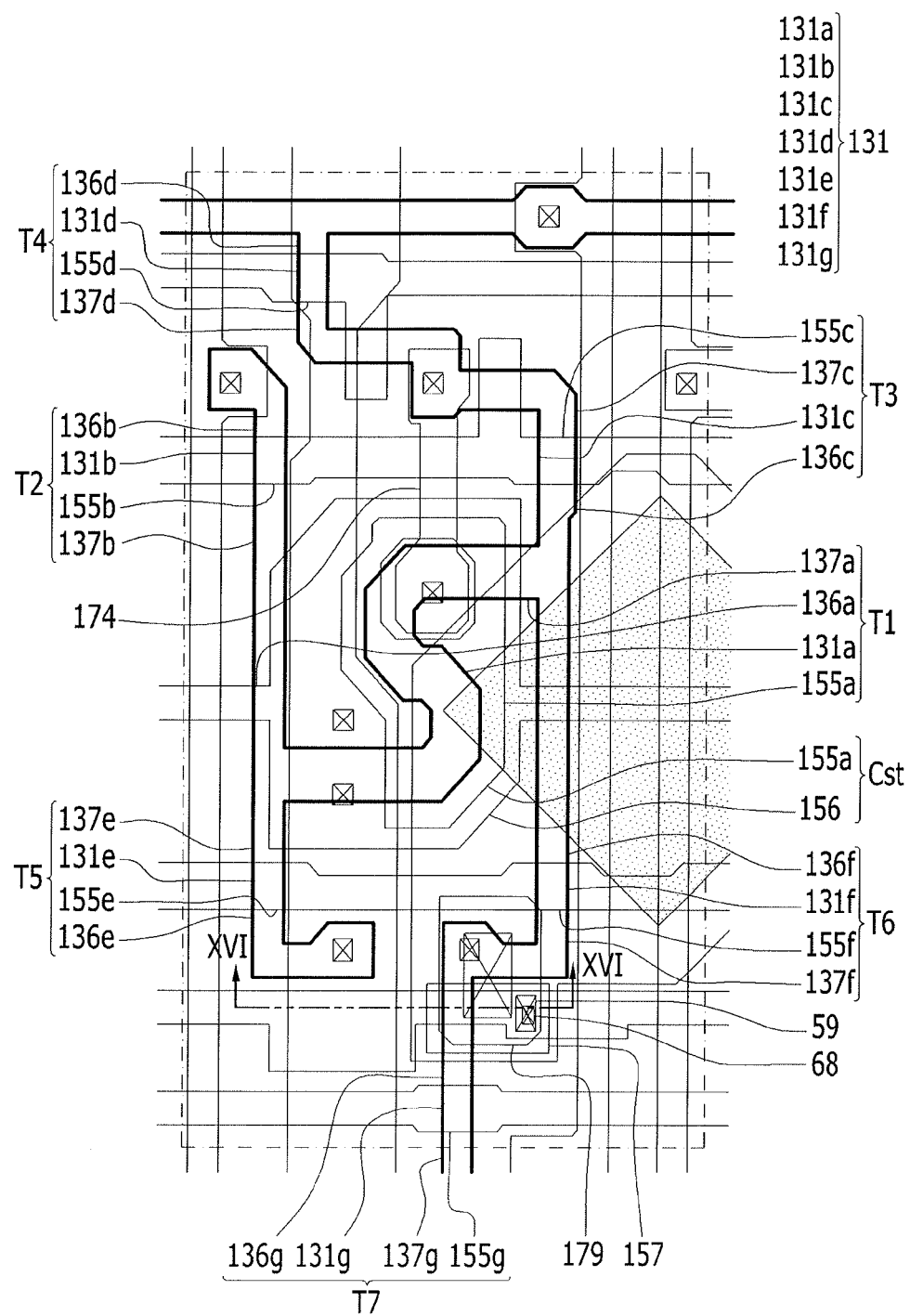
FIG. 15 illustrates another embodiment of a display.
Figure 16:
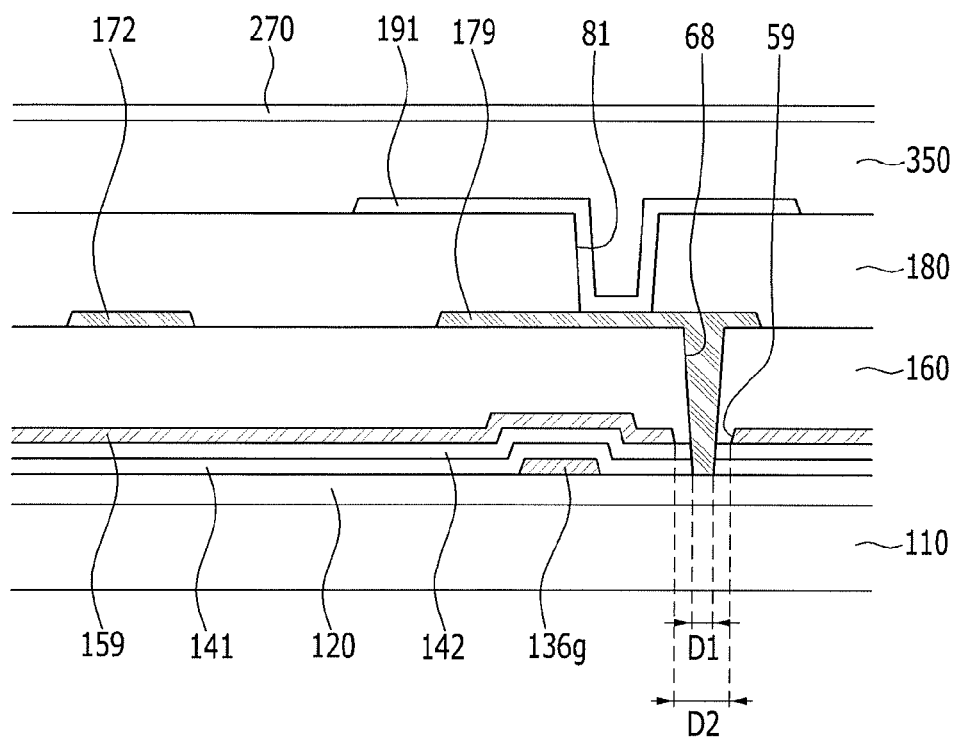
FIG. 16 illustrates view taken along section line XVI-XVI in FIG. 15.

FIG. 15 illustrates a layout view of another embodiment an organic light emitting diode display, and FIG. 16 is a cross-sectional view taken along line XVI-XVI in FIG. 15. The exemplary embodiment in FIG. 15 and FIG. 16 is substantially the same as the exemplary embodiment in FIG. 1, FIG. 2, FIG. 3, FIG. 4, FIG. 5, FIG. 6, FIG. 7, and FIG. 8, except for the repair line having the repair hole in which the shorting assistance part of the emission control connecting member is passed.

As shown in FIGS. 15 and 16, the semiconductor 130 including the bypass source electrode 136g is formed on the substrate 110, and the first gate insulating layer 141 covering the substrate 110 and the semiconductor 130 is formed thereon. The second gate insulating layer 142 is formed on the first gate insulating layer 141. The repair line 159 is formed on the second gate insulating layer 142. The repair line 159 has a repair hole 59 exposing the second gate insulating layer 142. The interlayer insulating layer 160 covering the second gate insulating layer 142 and the repair line 159 is formed thereon, and the emission control connecting member 179 is formed at the position overlapping the repair line 159 on the interlayer insulating layer 160.

The shorting hole 68 positioned inside the repair hole 59 is formed in the interlayer insulating layer 160, the second gate insulating layer 142, and the first gate insulating layer 141. The emission control connecting member 179 has the shorting assistance part 179a filling the shorting hole 68. The diameter D1 of the shorting hole 68 is smaller than the diameter D2 of the repair hole 59 to allow the shorting assistance part 179a of the emission control connecting member 179 to penetrate the repair hole 59 of the repair line 159 through the shorting hole 68. In this case, the melting point of the shorting assistance part 179a of the emission control connecting member 179 may be lower than the melting point of the repair line 159.

For example, the emission control connecting member 179 may include aluminum (Al), and the repair line 159 may include molybdenum (Mo). The melting point of aluminum (Al) is 660 degrees, the melting point of titanium (Ti) is 1668 degrees, the melting point of molybdenum (Mo) is 2623 degrees, the melting point of silicon nitride (SiNx) is 1900 degrees, the melting point of silicon dioxide (SiO$_2$) is 1725 degrees, and the melting point of silicon is 1414 degrees. Thus, the emission control connecting member 179 including aluminum (Al) may be melted more easily than the repair line 159 including molybdenum (Mo) by the laser beam L.

Figure 17:
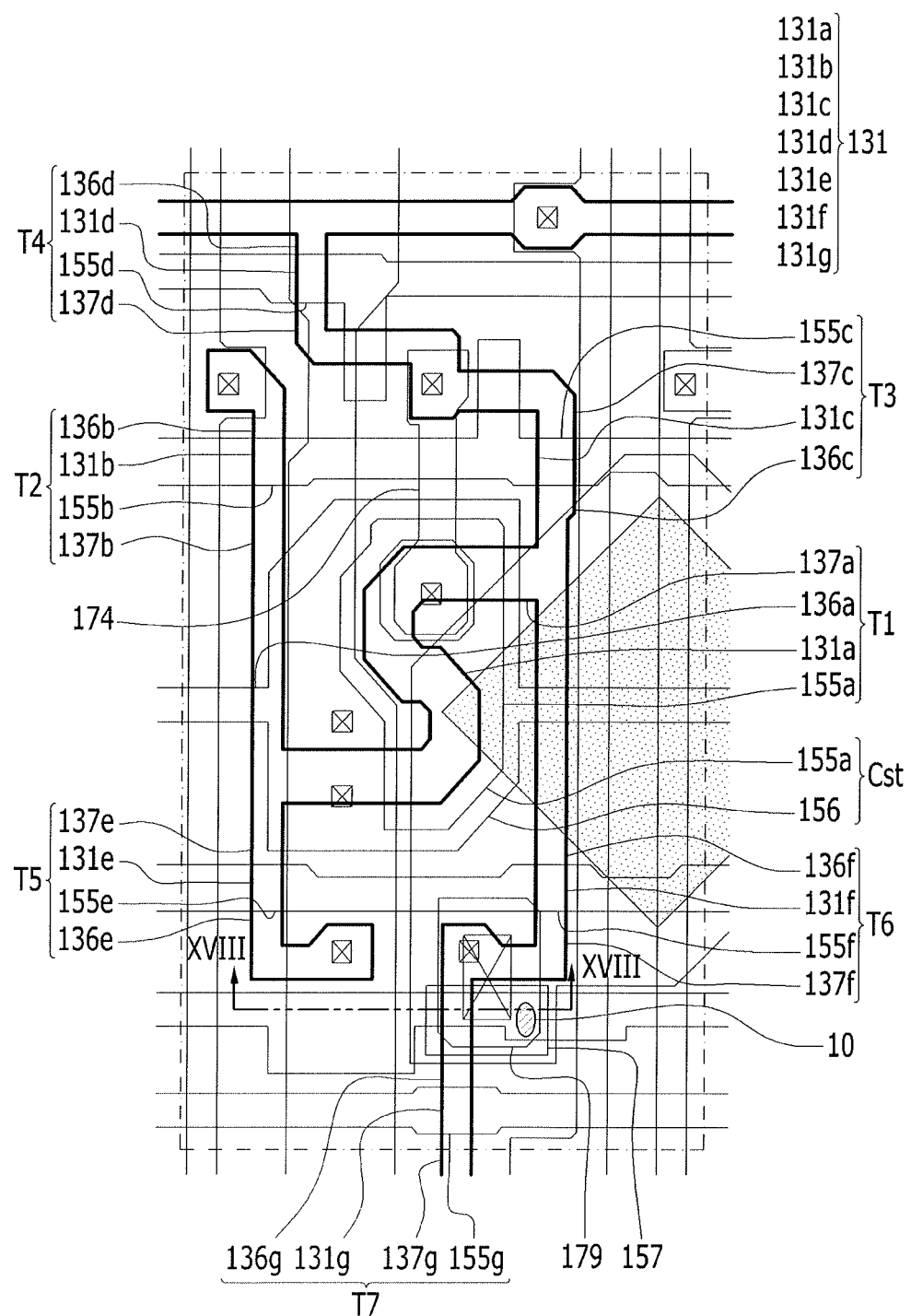
FIG. 17 illustrates a pixel relating to another embodiment of a repair method.
Figure 18:
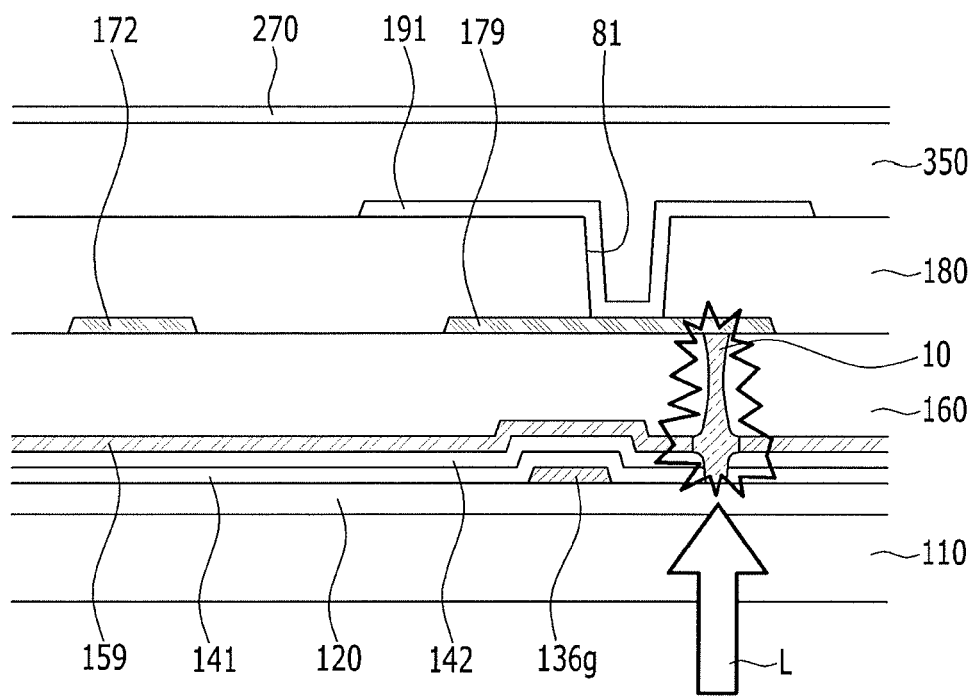
FIG. 18 illustrates a view along section line XVIII-XVIII in FIG. 17.

FIG. 17 is a layout view for explaining another embodiment of a repair method of an organic light emitting diode display. In this embodiment, a pixel circuit portion and an organic light emitting diode are isolated in one pixel and an emission control connecting member and a repair line are short-circuited using a laser beam. FIG. 18 illustrates a cross-sectional view along a line XVIII-XVIII in FIG. 17.

First, as shown in FIG. 17, the emission control drain electrode 137f of the emission control transistor T6 of the pixel circuit portion PI is connected to the organic light emitting diode OLD through the emission control connecting member 179. By cutting the emission control drain electrode 137f, the pixel circuit portion PI and the organic light emitting diode OLD may be isolated.

Next, as shown in FIG. 17 and FIG. 18, the shorting assistance part 179a of the emission control connecting member 179 penetrates the repair hole 59 of the repair line 159 through the shorting hole 68. Thus, when forming the shorting part 10 in the interlayer insulating layer 160 between the repair line 159 and the emission control connecting member 179 by irradiating the laser beam L, the laser beam L irradiated under the substrate 110 may be directly irradiated to the shorting assistance part 179a of the emission control connecting member 179 having the low melting point. Accordingly, the shorting part 10 may be easily formed between the repair line 159 and the emission control connecting member 179 having the low melting point.

In the exemplary embodiment shown in FIG. 15 and FIG. 16, only the repair line having the repair hole is formed. In an other embodiment, the first shorting assistance member generating the chain reaction with the repair line may overlap the repair line.

Figure 19:
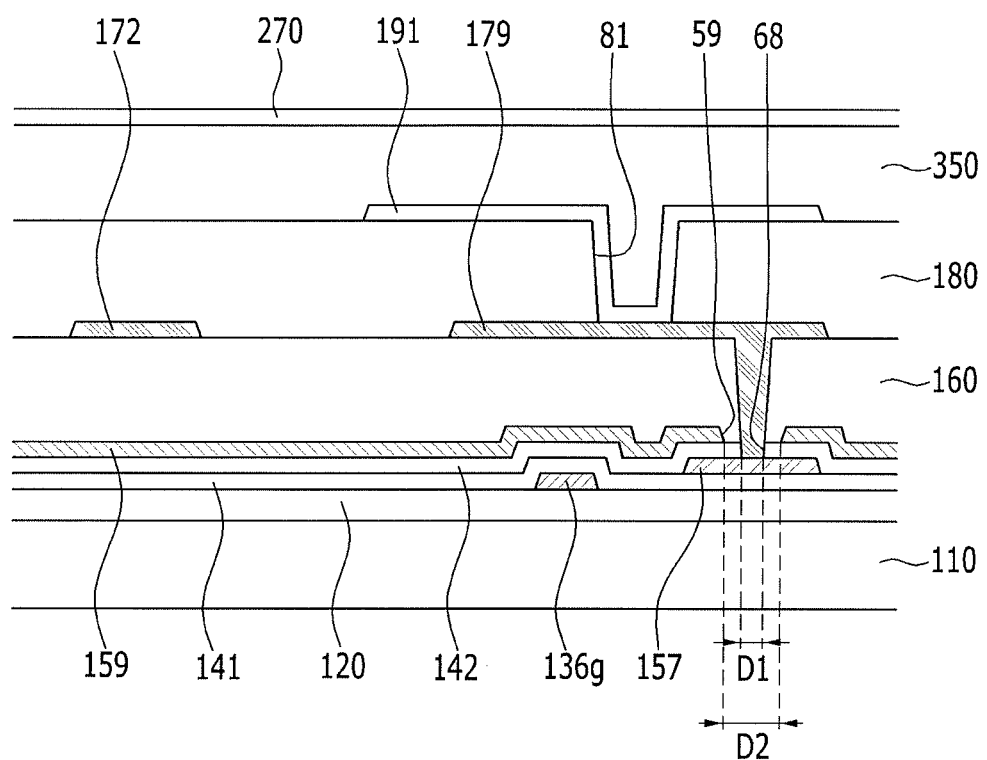
FIG. 19 illustrates another embodiment of a display.

FIG. 19 is a cross-sectional view for explaining another embodiment of an organic light emitting diode display. The exemplary embodiment in FIG. 19 is the substantially same as the exemplary embodiment in FIGS. 15 and 16, except for the first shorting assistance member.

As shown in FIG. 19, the semiconductor 130 including the bypass source electrode 136g is formed on the substrate 110, and the first gate insulating layer 141 covering the substrate 110 and the semiconductor 130 are formed thereon. The first shorting assistance member 157 is formed on the first gate insulating layer 141. The second gate insulating layer 142 covering the first gate insulating layer 141 and the first shorting assistance member 157 is formed thereon. The repair line 159 overlapping the first shorting assistance member 157 is formed on the second gate insulating layer 142. The repair line 159 has the repair hole 59 exposing the second gate insulating layer 142. The interlayer insulating layer 160 covering the second gate insulating layer 142 and the repair line 159 is formed thereon, and the emission control connecting member 179 is formed at the position overlapping the repair line 159 on interlayer insulating layer 160.

The shorting hole 68 positioned inside the repair hole 59 is formed in the interlayer insulating layer 160 and the second gate insulating layer 142. The emission control connecting member 179 has the shorting assistance part 179a filling the shorting hole 68. The shorting assistance part 179a of the emission control connecting member 179 penetrates the repair hole 59 of the repair line 159 through the shorting hole 68. As a result, when forming the shorting part 10 in the interlayer insulating layer 160 between the repair line 159 and the emission control connecting member 179 by irradiating the laser beam L, the shorting part 10 may be easily formed between the repair line 159 and the emission control connecting member 179 having the low melting point.

Also, the portion of the repair line 159 overlaps the first shorting assistance member 157 and the emission control connecting member 179. As a result, when forming the shorting part 10 in the interlayer insulating layer 160 between the repair line 159 and the emission control connecting member 179 by irradiating the laser beam L, a chain reaction is generated while the shorting part 10 is also formed in the second gate insulating layer 142 between the repair line 159 and the first shorting assistance member 157. The chain reaction allows the shorting part 10 to be easily formed between the repair line 159 and the emission control connecting member 179 using a low-energy laser beam L.

In the exemplary embodiment in FIG. 15 and FIG. 16, the first gate wire includes the scan line and the second gate wire includes the repair line. In another embodiment, the scan line and the repair line may be formed of the same gate wire.

Figure 20:
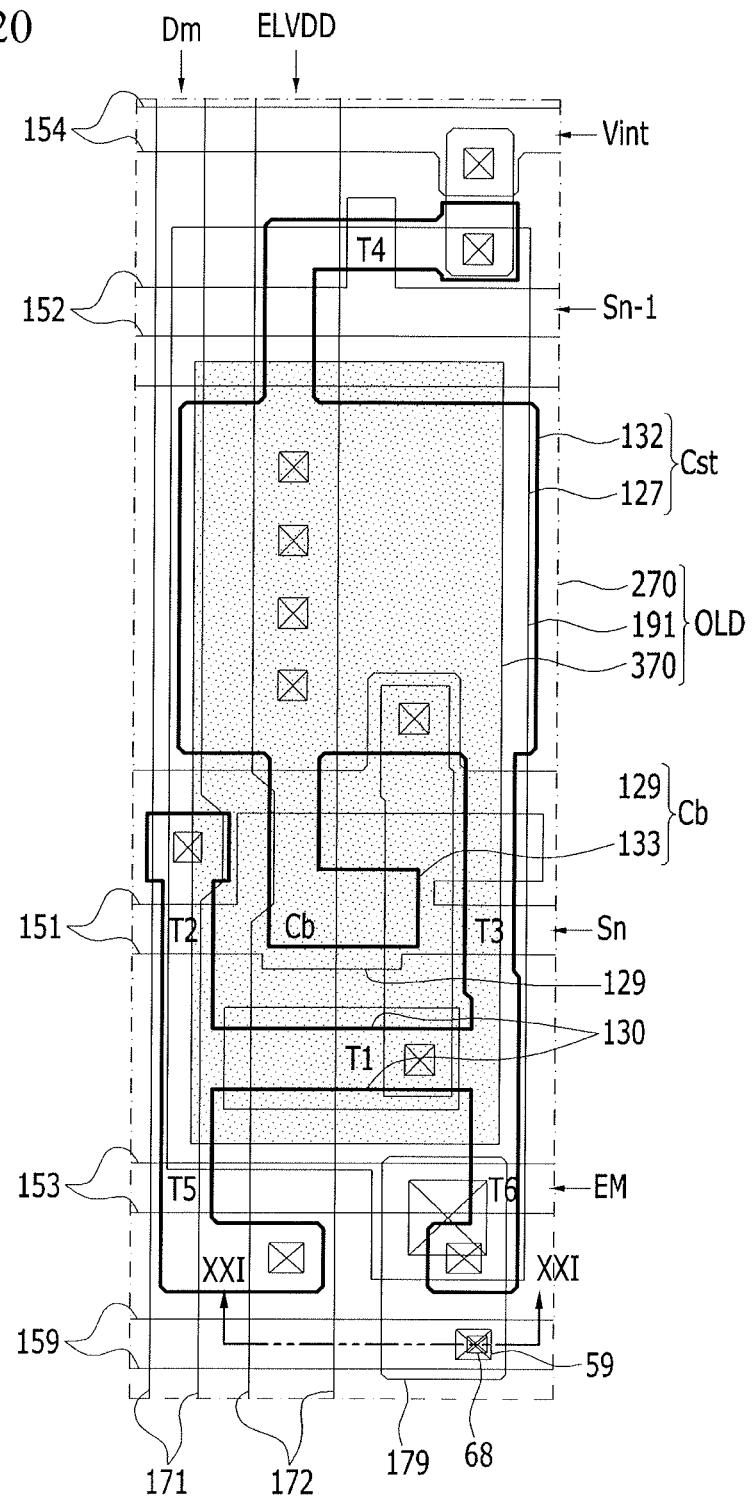
FIG. 20 illustrates another embodiment of a display.
Figure 21:
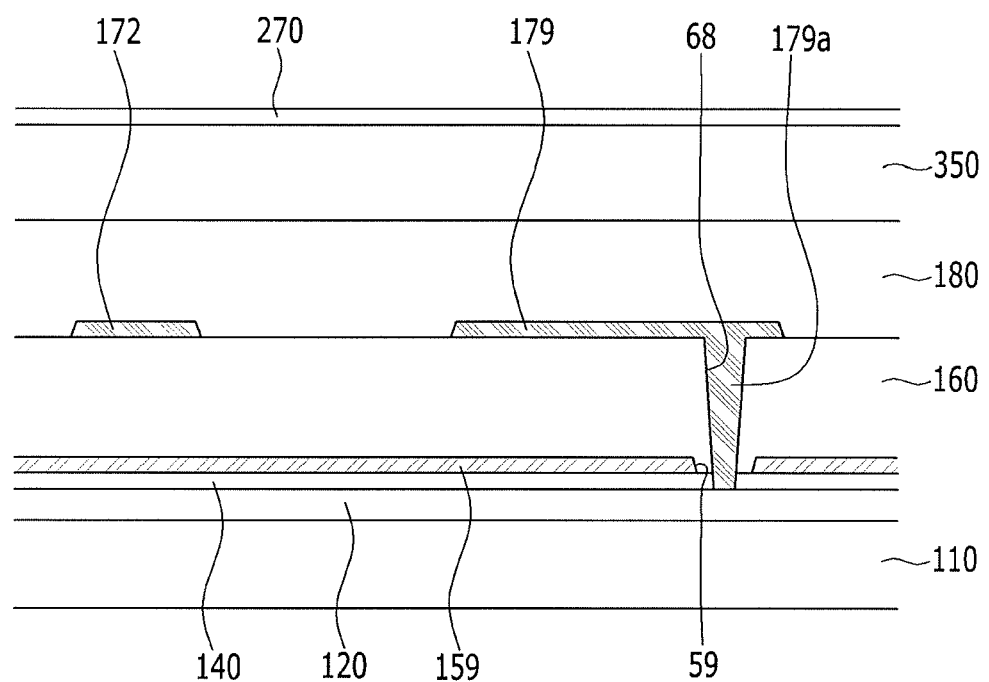
FIG. 21 illustrates a view along section line XXI-XXI in FIG. 20.

FIG. 20 is a detailed layout view of another embodiment of an organic light emitting diode display, and FIG. 21 is a cross-sectional view of the organic light emitting diode display of FIG. 20 taken along line XXI-XXI. The exemplary embodiment in FIG. 20 and FIG. 21 is substantially the same as the exemplary embodiment shown in FIGS. 15 and 16, except for the scan line and the repair line made of the same gate wire.

As shown in FIGS. 20 and 21, one pixel PX of the organic light emitting diode display includes a plurality of transistors connected to a plurality of signal lines, a storage capacitor Cst, a boosting capacitor Cb, and the organic light emitting diode OLD.

The signal lines include the scan line 151, the previous scan line 152, the emission control line 153, and the initialization voltage line 178 respectively applying the scan signal Sn, the previous scan signal S(n−1), the emission control signal EM, and the initialization voltage Vint and are formed in the row direction. The signal lines also include the data line 171 and the driving voltage line 172 crossing the scan line 151, the previous scan line 152, the emission control line 153, and the initialization voltage line 178 for respectively applying the data signal Dm and the driving voltage ELVDD to the pixel PX. In this case, the repair line 159 connected to the dummy circuit portion DI is parallel to the scan line 151.

The transistors include the driving transistor T1, the switching transistor T2, the compensation transistor T3, the initialization transistor T4, the operation control transistor T5, and the emission control transistor T6. Each channel of the driving transistor T1, the switching transistor T2, the compensation transistor T3, the initialization transistor T4, the operation control transistor T5, and the emission control transistor T6 is formed along the semiconductor 130. The semiconductor 130 is curved in various shapes.

The storage capacitor Cst includes a first storage electrode 132 and a second storage electrode 127 disposed via a gate insulating layer 140. The first storage electrode 132 is formed with the same layer as the driving channel 131a, the switching channel 131b, the compensation channel 131c, the initialization channel 131d, the operation control channel 131e, and the emission control channel 131f. The second storage electrode 127 is formed with the same layer as the scan line 151, the previous scan line 152, the emission control line 153, the initialization voltage line 178, and the repair line 159. The first storage electrode 132 includes the doping impurity.

A first boosting electrode 133 of the boosting capacitor Cb is an extension from the first storage electrode 132, and a second boosting electrode 129 is a protrusion vertically protruded from the scan line 151. The repair line has a repair hole overlapping the emission control connecting member.

Hereinafter, cross-sectional structures of the organic light emitting diode display device according to other exemplary embodiments will be described in detail according to a stacking order with reference to FIG. 21. In this case, a portion taken along a line XXI-XXI shown in FIG. 20 will be mainly described.

As shown in FIG. 21, the gate insulating layer 140 as the first insulating layer is formed on the substrate 110. The repair line 159 is formed on the gate insulating layer 140. The repair line 159 has the repair hole 59 exposing the gate insulating layer 140. The interlayer insulating layer 160 covering the gate insulating layer 140 and the repair line 159 is formed thereon, and the emission control connecting member 179 is formed on the interlayer insulating layer 160 at the position overlapping the repair line 159.

The interlayer insulating layer 160 and the gate insulating layer 140 has the shorting hole 68 positioned inside the repair hole 59. The emission control connecting member 179 has the shorting assistance part 179a filling the shorting hole 68. The shorting assistance part 179a of the emission control connecting member 179 penetrates the repair hole 59 of the repair line 159 through the shorting hole 68. Thus, when forming the shorting part 10 in the interlayer insulating layer 160 between the repair line 159 and the emission control connecting member 179 by irradiating the laser beam L, the shorting part 10 may be easily formed between the repair line 159 and the emission control connecting member 179 having the low melting point.

In the exemplary embodiment in FIGS. 20 and 21, only the repair line having the repair hole is formed. In another embodiment, the first shorting assistance member generating the chain reaction with the repair line may overlap the repair line.

Figure 22:
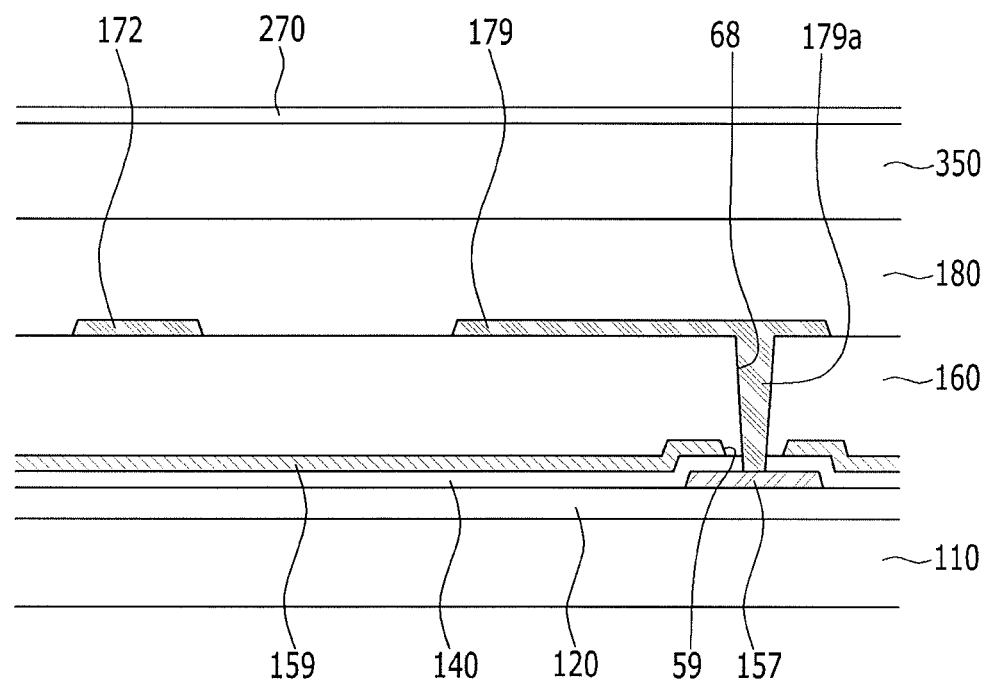
FIG. 22 illustrates another embodiment of a display.

FIG. 22 is a cross-sectional view of another embodiment of an organic light emitting diode display. The exemplary embodiment in FIG. 22 is substantially the same as the exemplary embodiment shown in FIGS. 20 and 21, except for the first shorting assistance member.

As shown in FIG. 22, the semiconductor 130 including the first shorting assistance member 157 is formed on the substrate 110, and the gate insulating layer 140 covering the substrate 110 and the semiconductor 130 is formed thereon. The repair line 159 overlapping the first shorting assistance member 157 is formed on the gate insulating layer 140. The repair line 159 has the repair hole 59 exposing the gate insulating layer 140. The interlayer insulating layer 160 covering the gate insulating layer 140 and the repair line 159 is formed thereon, and the emission control connecting member 179 is formed on the interlayer insulating layer 160 at the position overlapping the repair line 159.

The interlayer insulating layer 160 and the gate insulating layer 140 have the shorting hole 68 positioned inside the repair hole 59. The emission control connecting member 179 has the shorting assistance part 179a filling the shorting hole 68. The shorting assistance part 179a of the emission control connecting member 179 penetrates the repair hole 59 of the repair line 159 through the shorting hole 68. Thus, when forming the shorting part 10 in the interlayer insulating layer 160 between the repair line 159 and the emission control connecting member 179 by irradiating the laser beam L, the shorting part 10 may be easily formed between the repair line 159 and the emission control connecting member 179 having the low melting point.

Also, the portion of the repair line 159 overlaps the first shorting assistance member 157 and the emission control connecting member 179. Thus, when forming the shorting part 10 in the interlayer insulating layer 160 between the repair line 159 and the emission control connecting member 179 by irradiating the laser beam L, a chain reaction is generated while the shorting part 10 is also formed in the gate insulating layer 140 between the repair line 159 and the first shorting assistance member 157. The chain reaction allows the shorting part 10 to be easily formed between the repair line 159 and the emission control connecting member 179 using a low-energy laser beam L.

Example embodiments have been disclosed herein, and although specific terms are employed, they are used and are to be interpreted in a generic and descriptive sense only and not for purpose of limitation. In some instances, as would be apparent to one of skill in the art as of the filing of the present application, features, characteristics, and/or elements described in connection with a particular embodiment may be used singly or in combination with features, characteristics, and/or elements described in connection with other embodiments unless otherwise indicated. Accordingly, it will be understood by those of skill in the art that various changes in form and details may be made without departing from the spirit and scope of the invention as set forth in the following claims.

What is claimed is:

1. An organic light emitting diode display, comprising:
a substrate;

a scan line, on the substrate, to transmit a scan signal;
a repair line substantially parallel to the scan line;
a data line and a driving voltage line crossing the scan line, the data line and the driving voltage line to respectively transmit a data voltage and a driving voltage;
a switching transistor connected to the scan line and the data line;
a driving transistor connected to the switching transistor;
an organic light emitting diode connected to the driving transistor;
an emission control connector between the driving transistor and the organic light emitting diode, the emission control connector to connect the driving transistor and the organic light emitting diode and overlapping a portion of the repair line; and
a first shorting assistance material overlapping the repair line and the emission control connector, the first shorting assistance material to induce a chain reaction to allow a short to form between the repair line and the emission control connector when a laser beam in a predetermined energy range is applied.

2. The display as claimed in claim 1, wherein:
the repair line includes a different upper layer from the scan line, and
the first shorting assistance material includes a same layer as the scan line.

3. The display as claimed in claim 1, further comprising:
a semiconductor on the substrate;
a first insulating layer covering the semiconductor;
a second insulating layer on the first insulating layer; and
a third insulating layer on the second insulating layer,
wherein the scan line is on the first insulating layer and wherein the data line, the driving voltage line, and the emission control connector are on the third insulating layer.

4. The display as claimed in claim 3, wherein the scan line is on the first insulating layer and wherein the data line, the driving voltage line, and the emission control connector are on the third insulating layer.

5. The display as claimed in claim 4, wherein:
the repair line is on the second insulating layer, and
the first shorting assistance material is on the first insulating layer.

6. The display as claimed in claim 4, wherein:
the repair line includes a same layer as the scan line, and
the first shorting assistance material includes a different upper layer from the scan line.

7. The display as claimed in claim 6, wherein:
the repair line is on the first insulating layer, and
the first shorting assistance material is on the second insulating layer.

8. The display as claimed in claim 7, wherein:
the third insulating layer is on the first shorting assistance material and has a shorting hole exposing the first shorting assistance material; and
the emission control connector has a shorting assistance part that contacts the first shorting assistance material through the shorting hole.

9. The display as claimed in claim 7, further comprising:
a second shorting assistance material including a same layer as the semiconductor and overlapping the emission control connector and the repair line.

10. An organic light emitting diode display, comprising:
a substrate;
a scan line, on the substrate, to transmit a scan signal;
a repair line substantially parallel to the scan line and having a repair hole;
a data line and a driving voltage line crossing the scan line, the data line and the driving voltage line to respectively transmit a data voltage and a driving voltage;
a switching transistor connected to the scan line and the data line;
a driving transistor connected to the switching transistor;
an organic light emitting diode connected to the driving transistor; and
an emission control connector between the driving transistor and the organic light emitting diode, the emission control connector to connect the driving transistor and the organic light emitting diode and overlapping a portion of the repair line, wherein the emission control connector overlaps the repair hole.

11. The display as claimed in claim 10, further comprising:
a shorting hole inside the repair hole, and
the emission control connector includes a shorting assistance part in the shorting hole.

12. The display as claimed in claim 11, wherein a diameter of the shorting hole is less than a diameter of the repair hole.

13. The display as claimed in claim 11, further comprising:
a semiconductor on the substrate;
a first insulating layer covering the semiconductor;
a second insulating layer on the first insulating layer; and
a third insulating layer on the second insulating layer,
wherein the scan line is on the first insulating layer and wherein the data line, the driving voltage line, and the emission control connector are on the third insulating layer.

14. The display as claimed in claim 13, wherein the shorting hole is in the first insulating layer, the second insulating layer, and the third insulating layer.

15. The display as claimed in claim 13, wherein the repair line is on the second insulating layer.

16. The display as claimed in claim 15, further comprising:
a first shorting assistance material on the first insulating layer and in contact with and overlapping the shorting assistance part.

17. The display as claimed in claim 16, wherein the shorting hole is in the second insulating layer and the third insulating layer.

18. The display as claimed in claim 11, wherein a melting point of the shorting assistance part of the emission control connector is lower than a melting point of the repair line.

19. The display as claimed in claim 18, wherein the emission control connector includes aluminum and the repair line includes molybdenum.

20. The display as claimed in claim 11, further comprising:
a semiconductor on the substrate;
a first insulating layer covering the semiconductor; and
a second insulating layer on the first insulating layer,
wherein the scan line is on the first insulating layer and wherein the data line, the driving voltage line, and the emission control connector are on the second insulating layer.

21. The display as claimed in claim 20, wherein the shorting hole is in the first insulating layer and the second insulating layer.

22. The display as claimed in claim 21, wherein the repair line is on the first insulating layer.

23. The display as claimed in claim 22, further comprising:
a first shorting assistance material on the substrate and overlapping and in contact with the shorting assistance part.

24. The display as claimed in claim 23, wherein the shorting hole is in the first insulating layer and the second insulating layer.

25. The display as claimed in claim 24, wherein the first shorting assistance material includes a same layer and a same material as the semiconductor.

* * * * *